US008729695B2

(12) United States Patent
Premachandran et al.

(10) Patent No.: US 8,729,695 B2
(45) Date of Patent: May 20, 2014

(54) WAFER LEVEL PACKAGE AND A METHOD OF FORMING A WAFER LEVEL PACKAGE

(75) Inventors: Chirayarikathu Veedu Sankarapillai Premachandran, Singapore (SG); Rakesh Kumar, Singapore (SG); Nagarajan Ranganathan, Singapore (SG); Won Kyoung Choi, Singapore (SG); Ebin Liao, Singapore (SG); Yasuyuki Mitsuoka, Chiba (JP); Hiroshi Takahashi, Chiba (JP); Ryuta Mitsusue, Chiba (JP)

(73) Assignees: Agency for Science, Technology and Research, Singapore (SG); Seiko Instruments, Inc., Chiba (JP)

( * ) Notice: Subject to any disclaimer, the term of this patent is extended or adjusted under 35 U.S.C. 154(b) by 228 days.

(21) Appl. No.: 13/497,611

(22) PCT Filed: Sep. 25, 2009

(86) PCT No.: PCT/SG2009/000355
§ 371 (c)(1),
(2), (4) Date: Oct. 5, 2012

(87) PCT Pub. No.: WO2011/037534
PCT Pub. Date: Mar. 31, 2011

(65) Prior Publication Data
US 2013/0020713 A1 Jan. 24, 2013

(51) Int. Cl.
*H01L 23/12* (2006.01)
*H01L 21/00* (2006.01)

(52) U.S. Cl.
USPC ........... 257/704; 257/678; 257/684; 257/588; 257/710; 257/E23.18; 257/E23.193; 438/53; 438/106; 438/127

(58) Field of Classification Search
USPC ................. 257/678, 684, 688, 704, 710, 773, 257/E23.18, E23.193; 438/53, 106, 127
See application file for complete search history.

(56) References Cited

U.S. PATENT DOCUMENTS 6,062,461 A 5/2000 Sparks et al.
6,479,320 B1 11/2002 Gooch
(Continued)

FOREIGN PATENT DOCUMENTS

WO 2006097842 9/2006
WO 2006101689 9/2006
WO 2006124597 11/2006

OTHER PUBLICATIONS

Corman, et al., Low-pressure-encapsulated resonant structures with integrated electrodes for electrostatic excitation and capacitive detection, Sensor and Actuators, A66, pp. 160-166, 1998.

(Continued)

*Primary Examiner* — Jasmine Clark
(74) *Attorney, Agent, or Firm* — K. David Crockett, Esq.; Niky Economy Syrengelas, Esq.; Crockett & Crockett, PC

(57) ABSTRACT

In an embodiment, a wafer level package may be provided. The wafer level package may include a device wafer including a MEMS device, a cap wafer disposed over the device wafer, at least one first interconnect disposed between the device wafer and the cap wafer and configured to provide an electrical connection between the device wafer and the cap wafer, and a conformal sealing ring disposed between the device wafer and the cap wafer and configured to surround the at least one first interconnect and the MEMS device so as to provide a conformally sealed environment for the at least one first interconnect and the MEMS device, wherein the conformal sealing ring may be configured to conform to a respective suitable surface of the device wafer and the cap wafer when the device wafer may be bonded to the cap wafer. A method of forming a wafer level package may also be provided.

20 Claims, 16 Drawing Sheets

(56) References Cited

U.S. PATENT DOCUMENTS

| | | | |
|---|---|---|---|
| 6,812,558 B2* | 11/2004 | Chen et al. | 257/688 |
| 6,846,725 B2* | 1/2005 | Nagarajan et al. | 438/456 |
| 6,890,836 B2 | 5/2005 | Howard et al. | |
| 7,030,432 B2* | 4/2006 | Ma | 257/254 |
| 7,170,155 B2* | 1/2007 | Heck et al. | 257/684 |
| 7,456,497 B2* | 11/2008 | Higashi | 257/704 |
| 7,629,201 B2* | 12/2009 | Gan et al. | 438/106 |
| 8,143,082 B2* | 3/2012 | Dungan et al. | 438/50 |
| 2004/0140557 A1 | 7/2004 | Sun et al. | |
| 2004/0259325 A1 | 12/2004 | Gan | |
| 2005/0269688 A1 | 12/2005 | Shiv | |
| 2006/0220173 A1 | 10/2006 | Gan et al. | |
| 2007/0099395 A1 | 5/2007 | Sridhar et al. | |
| 2007/0235501 A1 | 10/2007 | Heck | |
| 2008/0283990 A1 | 11/2008 | Nasiri et al. | |
| 2009/0029526 A1 | 1/2009 | Chang-Chien et al. | |

OTHER PUBLICATIONS

Min, et al., W-Band Low-Loss Wafer-Scale Package for RF MEMS, Byung-Wook Min, U. of Michigan, 2009.

Liang, et al., A Wafer-Level Hermetic Encapsulation for MEMs Manufacture Application by Liang et al., IEEE Transactions on Advanced Packaging, vol. 29, No. 3, pp. 513-519, Aug. 2006.

Chae, et al., Fabrication and Characterization of a wafer-level MEMs Vacuum Package with Vertical Feedthroughs, JMEMS, pp. 193-200, Feb. 2008.

www.planoptik.com/en/news/news_2006_10_16.pdf, Electrical feedthrough wafers for waferlevel packaging Conductive vias through silicon and glass wafers, 2006.

Oberhammer, Novel RF MEMs Switch and Packaging Concepts, Microsystem Technology Department of Signals, Sensors and Systems Royal Institute of Technology, pp. 82-84, 2004.

* cited by examiner

1. SOI WAFER OF 10μm THICKNESS

5. OXIDE STRIP AND RELEASE ETCH

2. RESONATOR AND PRECUT PATTERNING

6. THERMAL COMPENSATION OXIDATION

3. PRECUT ETCHING WITH SELECTIVE MASK

7. DRY FILM LAMINATION AND PATTERNING

4. RESIST STRIP AND PRECUT AND STRUCTURE ETCH

8. UBM AND SOLDER PATTERN FORMATION

1. BACKSIDE ALIGNMENT MARK AND DICING LINE

5. OXIDE OPENING

2. OXIDE DEPOSITION: SiO$_2$ (1μm)

6. UBM DEPOSITION AND PATTERNING AND CAVITY ETCH

3. PAD METAL DEPOSITION

7. SOLDER DEPOSITION AND LIFT-OFF

4. OXIDE DEPOSITION: SiO$_2$

ALIGNING CAP WAFER AND MEMS WAFER

WAFER VACUUM BONDING

BACKSIDE PRECUT ALIGNMENT MARK

STARTING ARRANGEMENT OF CAP WAFER AND MEMS WAFER ON A DICING TAPE

HALF CUT FROM PRECUT SIDE OF THE MEMS WAFER

IP THE ARRANGEMENT OF CAP WAFER AND MEMS WAFER AND REMOUNT ON THE DICING TAPE

FULL CUT THE CAP WAFER AND MEMS WAFER FROM THE SECOND CAP SURFACE OF THE CAP WAFER

ARRANGEMENT OF THE DICED CAP WAFER AND THE MEMS WAFER

WAFER LEVEL PACKAGE AND A METHOD OF FORMING A WAFER LEVEL PACKAGE

TECHNICAL FIELD

Embodiments relate to a wafer level package and a method of forming a wafer level package.

BACKGROUND

Cost and size reduction is driving packaging industry to new measures and approaches. Wafer level packaging is one approach which the packaging industry is looking into for size and cost reduction. Since wafer level packaging is a batch process and is almost a true chip size package, cost and real estate can be reduced. A further reduction in size may be achieved by integrating different devices into a single package.

Wafer level packaging may also be used for Micro-Electro-Mechanical Systems (MEMS) devices to meet the requirements of size, cost, hermeticity and vacuum. For MEMS devices which have moving parts or suspended beams, air inside the MEMS device package may dampen the moving parts. Therefore, there is a need to maintain a vacuum within the MEMS device package in order to prevent damping of the moving parts or suspended beams. Further vacuum is a poor conductor of heat and this may be used for MEMS device package to allow for high thermal isolation or stability.

Therefore, there is a need for a wafer level packing for MEMS device which may provide good vacuum reliability within the MEMS device package.

SUMMARY

In various embodiments, a wafer level package may be provided. The wafer level package may include a device wafer including a MEMS device; a cap wafer disposed over the device wafer; at least one first interconnect disposed between the device wafer and the cap wafer and configured to provide an electrical connection between the device wafer and the cap wafer; and a conformal sealing ring disposed between the device wafer and the cap wafer and configured to surround the at least one first interconnect and the MEMS device so as to provide a conformally sealed environment for the at least one first interconnect and the MEMS device; wherein the conformal sealing ring may be configured to conform to a respective suitable surface of the device wafer and the cap wafer when the device wafer is bonded to the cap wafer.

In various embodiments, a method of forming a wafer level package may also be provided. The method may include forming a device wafer including a MEMS device, forming a cap wafer over the device wafer; forming at least one first interconnect between the device wafer and the cap wafer such that the at least one first interconnect may be configured to provide an electrical connection between the device wafer and the cap wafer; and forming a conformal sealing ring between the device wafer and the cap wafer such that the conformal sealing ring may be configured to surround the at least one first interconnect and the MEMS device so as to provide a conformally sealed environment for the at least one first interconnect and the MEMS device; wherein forming the conformal sealing ring may include forming the conformal sealing ring such that the conformal sealing ring may be configured to conform to a respective suitable surface of the device wafer and the cap wafer when the device wafer may be bonded to the cap wafer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments of the invention are described with reference to the following drawings, in which.

DESCRIPTION

Figure 1:
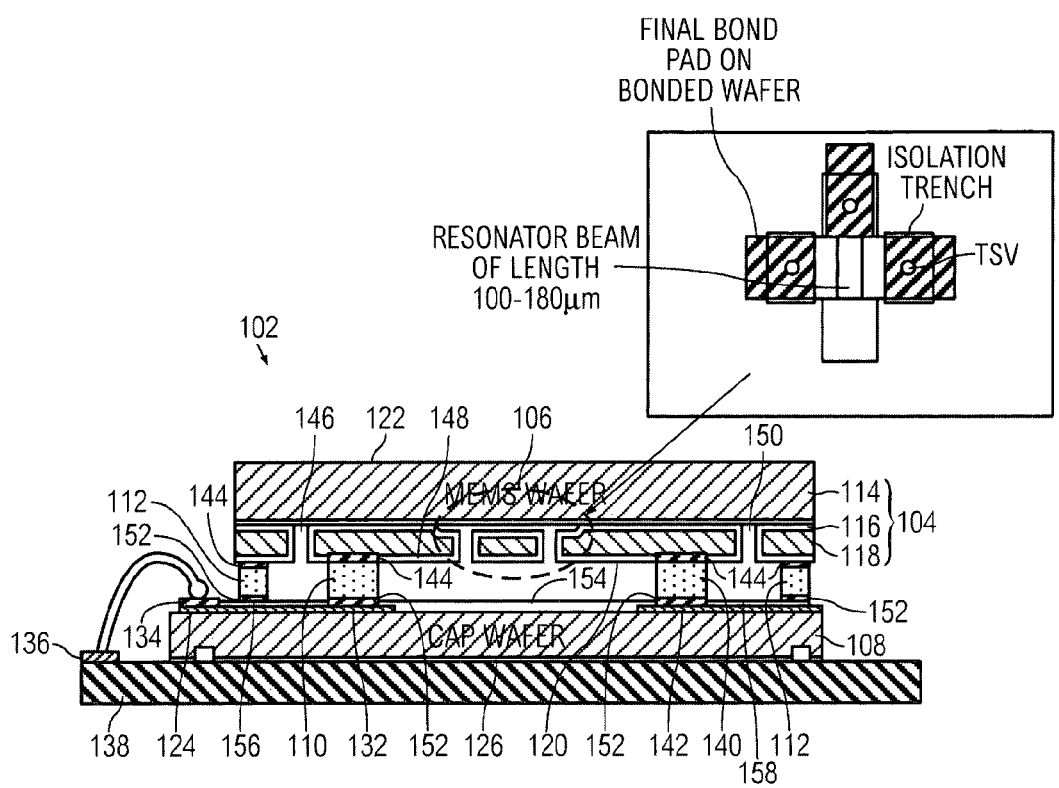
FIG. 1 shows a cross-sectional view of a wafer level package according to an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

An embodiment provides for a wafer level package. The wafer level package may include a device wafer including a MEMS device, a cap wafer disposed over the device wafer, at least one first interconnect disposed between the device wafer and the cap wafer and configured to provide an electrical connection between the device wafer and the cap wafer, and a conformal sealing ring disposed between the device wafer and the cap wafer and configured to surround the at least one first interconnect and the MEMS device so as to provide a conformally sealed environment for the at least one first interconnect and the MEMS device, wherein the conformal sealing ring is configured to conform to a respective suitable surface of the device wafer and the cap wafer when the device wafer is bonded to the cap wafer.

In an embodiment, the at least one first interconnect may include two relatively level or flat surfaces in contact with the respective device wafer and cap wafer. Using solder bonding process or conformal sealing process, a flat surface may not required for bonding between the at least one first interconnect disposed between the device and cap wafer. Since solder has a thickness of 8 um to 10 um, a level differece across the device wafer surface may be accommodated during wafer bonding. In the case of eutectic bonding, the respective device wafer and the cap wafer shall be made flat in order to make contact with each other because there may not be an intermediate layer between the respective device wafer and the cap wafer. Moreover, there may be a thickness variation across each of the respective device wafer and the cap wafer which may be about +/−2 um. Further, due to long process steps, respective device wafer and the cap wafer may be subjected to warpage and this may provide an additional variation across the respective device wafer and cap wafer. So the variation in respective device wafer and cap wafer thickness and warpage may affect bonding done with eutectic method but may not be observed for bonding with solder for conformal sealing and bonding process In an embodiment, the MEMS device may include a resonator, a switch, an oscillator, an accelerometer, a gyroscope, an infrared (IR) microbolometer, a tactile sensor, an absolute pressure sensor, a magnetic field sensor, an angular rate sensor, for example.

In an embodiment, the device wafer may include a silicon on insulator (SOI) substrate. The SOI substrate may include a support layer, an insulator layer disposed on the support layer and a device layer disposed on the insulator layer. The device layer may be electrically insulated from the support layer by the insulating layer. The support layer may include silicon, sapphire, polysilicon, silicon oxide, silicon nitride for example. The insulating layer may include silicon oxide, polymer, dielectric material for example. The device layer may include silicon, gallium arsenide, silicon-germanium for example.

In an embodiment, the MEMS device may be formed on the device layer of the device wafer.

In an embodiment, the cap wafer may serve to protect the MEMS device and may include silicon, polymer, glass, ceramic, silicon carbide (SiC), thermoplastic, metal, for example. The cap wafer may include a cavity configured to accommodate the MEMS device when the cap wafer may be disposed over the device wafer. The cavity may be dimensioned according to the dimensions of the MEMS device and the presence of the cavity may be required as it may avoid physical contact with the MEMS devices which may be moving there within and also provide vacuum inside the package.

The device wafer may include two opposing surfaces, a first device surface and a second device surface. Similarly, the cap wafer may include two opposing surfaces, a first cap surface and a second cap surface. The first device surface and the first cap surface may be the respective active surfaces of the device wafer and the cap wafer, while the second device surface and the second cap surface may be the respective passive surfaces of the device wafer and the cap wafer. The first device surface may face towards the first cap surface and the second device surface may face away the second cap surface when the respective device wafer and the cap wafer may be bonded together. Each of the respective device wafer or the cap wafer may include precuts formed on the respective first device surface or the first cap surface. Each of the respective device wafer and the cap wafer may include backside alignment marks and dicing lines formed on the respective second device surface and the second cap surface. The formation of the precuts, backside alignment marks and the dicing marks (dicing marks corresponding to the precut and dicing marks for singulation) on the respective surfaces of the device wafer and the cap wafer may serve as a reference when separating the MEMS device package or dicing between the respective MEMS device package.

In an embodiment, precut may be made on the first surface of the device wafer by deep reactive-ion etching (DRIE) etching, around 140 to 150 um deep, for example. The precut may be required to cut open the bond pads of the lateral feed through. The presence of the precut may avoid damaging of the lateral feed through traces during the half dicing. The precut may be formed only on the first surface of either the device wafer or the cap wafer. As an example, the precut may be formed on the device wafer and hence backside dicing mark may be required on the second surface of the device wafer. In a further example, the precut may be formed on the first surface of the cap wafer and dicing may be required on the second surface of the cap wafer. Therefore there may be a dicing mark corresponding to the precut on the second surface of the cap wafer and the dicing mark corresponding to the precut may be positioned beside the dicing marks for the chip singulation, that may be required for every silicon wafer. Therefore, generally, there may be an additional precut dicing mark positioned on the second surface of a device wafer or a cap wafer which may include a precut on the first surface. Alignment marks may be provided on the second surface of either or both the device wafer and the cap wafer to align the cap wafer and the device wafer. Before carrying out the wafer to wafer bonding, the device wafer and cap wafer may be aligned to make sure that the sealing ring and the bond pads are aligned to each other correctly for bonding. As an example, the wafer to wafer bonding of the device wafer and the cap wafer may be done by aligning the backside alignment mark on the second surface of the device wafer to the alignment mark on the second surface of the cap wafer. Any suitable method may be used for aligning the respective device wafer and the cap wafer and the method may be different depending on the device type and the ease of bonding between the respective device wafer and the cap.

In an embodiment, the wafer level package may further include a first electrical interconnect disposed on the first cap surface of the cap wafer and in electrical contact with the at least one first interconnect.

In an embodiment, the first electrical interconnect may be configured to route the at least one first interconnect along the first cap surface of the cap wafer to crossing the conformal sealing ring to the outside of the sealed environment.

In an embodiment, the first electrical interconnect may include any conductive material. The first electrical interconnect may include copper (Cu), aluminum (Al), gold (Au), platinum (Pt), silver (Ag), protactinium (Pa), nickel (Ni), cobalt (Co), tungsten (W), titanium (Ti), tantalum (Ta), zinc (Zn), magnesium (Mg), rhodium (Rh), iridium (Ir), for example.

In an embodiment, the wafer level package may further include at least one second interconnect disposed between the device wafer and the cap wafer and configured to provide an electrical connection between the device wafer and the cap wafer.

In an embodiment, the at least one second interconnect may be disposed within the conformal sealing ring.

In an embodiment, the at least one first interconnect may be disposed on one side of the MEMS device and the at least one second interconnect may be disposed on another side of the MEMS device.

In an embodiment, the wafer level package may further include a second electrical interconnect disposed on the cap wafer and in electrical contact with the at least one second interconnect.

In an embodiment, the second electrical interconnect may be configured to route the at least one second interconnect along the first cap surface of the cap wafer to crossing the conformal sealing ring to the outside of the sealed environment.

In an embodiment, the second electrical interconnect may include any conductive material. The second electrical interconnect may include copper (Cu), aluminum (Al), gold (Au), platinum (Pt), silver (Ag), protactinium (Pa), nickel (Ni), cobalt (Co), tungsten (W), titanium (Ti), tantalum (Ta), zinc (Zn), magnesium (Mg), rhodium (Rh), iridium (Ir), for example.

In an embodiment, the conformal sealing ring may be made of a conformal material which may provide a conformal bonding.

In an embodiment, each of the at least one first interconnect and the at least one second interconnect may be made of the same conformal material as the conformal sealing ring.

In an embodiment, each of the at least one first interconnect and the at least one second interconnect may be made of a different material as the conformal sealing ring.

In an embodiment, the conformal material may be selected from a group of materials consisting of gold-tin alloy, frit glass, polymer, solders such as lead-tin (PbSn), tin-gold-copper (SnAgCu), gold-indium (AuIn), copper-indium (CuIn), copper-tin (CuSn), gold-indium (AgIn), or any suitable combinations of Au, Ag, Cu, Sn, In and bismuth (Bi), for example.

In an embodiment, the conformal sealing ring, the at least one first interconnect and the at least one second interconnect may be formed in a common processing step.

In an embodiment, the at least one first interconnect may be electrically isolated from the conformal sealing ring and the at least one second interconnect may be electrically isolated from the conformal sealing ring.

In an embodiment, the conformal sealing ring may be electrically isolated from the device wafer by a dielectric layer positioned between the conformal sealing ring and the device wafer. The conformal sealing ring may also be electrically isolated from the cap wafer by a further dielectric layer positioned between the conformal sealing ring and the cap wafer.

In an embodiment, the wafer level package may further include at least one third interconnect disposed between the device wafer and the cap wafer. There may be one third interconnect or a plurality of third interconnects depending on user and design requirements.

In an embodiment, the at least one third interconnect may be disposed outside of the conformal sealing ring.

In an embodiment, the second electrical interconnect may electrically connect the at least one second interconnect to the at least one third interconnect.

In an embodiment, the wafer level package may further include a third electrical interconnect disposed on the device wafer and electrically connect the at least one third interconnect to an external connection.

In an embodiment, the third electrical interconnect may include any conductive material. The third electrical interconnect may include copper (Cu), aluminum (Al), gold (Au), platinum (Pt), silver (Ag), protactinium (Pa), nickel (Ni), cobalt (Co), tungsten (W), titanium (Ti), tantalum (Ta), zinc (Zn), magnesium (Mg), rhodium (Rh), iridium (Ir), for example.

In an embodiment, the wafer level package may further include a first through via formed in the cap wafer. The first through via may extend through the cap wafer from one surface to another surface. Alternatively, the first through via may be formed in the device wafer. The position and number of first through via may differ according to design and user requirements.

In an embodiment, the wafer level package may further include a fourth electrical interconnect disposed in the first through via and in electrical contact with the first electrical interconnect so as to electrically connect the first electrical interconnect to an external connection.

In an embodiment, the fourth electrical interconnect may include any conductive material. The fourth electrical interconnect may include copper (Cu), aluminum (Al), gold (Au), platinum (Pt), silver (Ag), protactinium (Pa), nickel (Ni), cobalt (Co), tungsten (W), titanium (Ti), tantalum (Ta), zinc (Zn), magnesium (Mg), rhodium (Rh), iridium (Ir), for example.

In an embodiment, the wafer level package may further include a second through via formed in the cap wafer. The second through via may extend through the cap wafer from one surface to another surface. Alternatively, the second through via may be formed in the device wafer. The position and number of second through via may differ according to design and user requirements.

In an embodiment, the wafer level package may further include a fifth electrical interconnect disposed in the second through via and in electrical contact with the second electrical interconnect so as to electrically connect the second electrical interconnect to an external connection.

In an embodiment, the fifth electrical interconnect may include any conductive material. The fifth electrical interconnect may include copper (Cu), aluminum (Al), gold (Au), platinum (Pt), silver (Ag), protactinium (Pa), nickel (Ni), cobalt (Co), tungsten (W), titanium (Ti), tantalum (Ta), zinc (Zn), magnesium (Mg), rhodium (Rh), iridium (Ir), for example.

In an embodiment, the first through via may be positioned on one side of the MEMS device and the second through via may be positioned on another side of the MEMS device. The first through via and the second through via may be positioned on any suitable position according to design and user requirements.

In an embodiment, the conformal sealing ring may be connected to a ground connection.

In an embodiment, the wafer level package may include a plurality of bonding pads formed on the active surfaces of the respective device wafer and the cap wafer. On the active surface of the device wafer, the bonding pads may be disposed on the respective positions where the respective conformal sealing ring, the at least one first interconnect, the at least one second interconnect and the at least one third interconnect may be coupled to the device wafer. Similarly, on the active surface of the cap wafer, the bonding pads may be disposed on the respective positions where the respective conformal sealing ring, the at least one first interconnect, the at least one second interconnect and the at least one third interconnect may be coupled to the cap wafer.

Further on the active surface of the device wafer, the bonding pads on one side of the MEMS device which correspond to the respective at least one first interconnect and the conformal sealing ring may be electrically isolated from each other by a trench formed in the device wafer. Also on the active surface of the device wafer, the bonding pads on an opposite side of the MEMS device which correspond to the respective at least one second interconnect and the conformal sealing ring may also be electrically isolated from each other by a further trench formed in the device wafer.

In an embodiment, the wafer level package may include a plurality of under bump metallurgic (UBM) structures disposed on the respective bonding pads on the device wafer and the cap wafer. Each of the respective UBM structure may be disposed over each bonding pad and positioned between each bonding pad and each of the respective conformal sealing ring, the at least one first interconnect, the at least one second interconnect and the at least one third interconnect. Each of the UBM structure may include a stacked layer arrangement including a plurality of layers stacked above one another. Each of the UBM structure may include any suitable number of layers stacked above one another. The layers may include materials such as Titanium (Ti), Platinum (Pt), Nickel (Ni), combinations of Al, Au, Ag, Pa, Co, W, Ta, Zn, Mg, for example. Each of the UBM structure may also include any suitable combination of layers of materials.

In an embodiment, the first electrical interconnect, the second electrical interconnect, the third electrical interconnect, the fourth electrical interconnect and the fifth electrical interconnect may be of a same material or of a different material.

In an embodiment, the at least one first interconnect, the at least one second interconnect and the at least one third interconnect may be of the same material or of different material.

In an embodiment, the number of bonding pads, the number of the respective first electrical interconnect, the second electrical interconnect, the third electrical interconnect, the fourth electrical interconnect and the fifth electrical interconnect may differ according to design and user requirements.

In an embodiment, the cross-sectional dimension of the respective conformal sealing ring, the at least one first interconnect, the at least one second interconnect and the at least one third interconnect may vary depending on design and user requirements.

In an embodiment, the first electrical interconnect, the second electrical interconnect, the third electrical interconnect, the fourth electrical interconnect and the fifth electrical interconnect may be termed the lateral feed through.

In an embodiment, the fourth electrical interconnect and the fifth electrical interconnect may be termed the vertical feed through.

An embodiment provides for a method of forming a wafer level package. The method may include forming a device wafer including a MEMS device; forming a cap wafer over the device wafer; forming at least one first interconnect between the device wafer and the cap wafer such that the at least one first interconnect may be configured to provide an electrical connection between the device wafer and the cap wafer; and forming a conformal sealing ring between the device wafer and the cap wafer such that the conformal sealing ring may be configured to surround the at least one first interconnect and the MEMS device so as to provide a conformally sealed environment for the at least one first interconnect and the MEMS device; wherein forming the conformal sealing ring may include forming the conformal sealing ring such that the conformal sealing ring may be configured to conform to a respective suitable surface of the device wafer and the cap wafer when the device wafer may be bonded to the cap wafer.

In an embodiment, forming the at least one first interconnect between the device wafer and the cap wafer such that the at least one first interconnect may be configured to provide an electrical connection between the device wafer and the cap wafer may include forming the at least one first interconnect such that the at least one first interconnection may include two relatively level or flat surfaces in contact with the respective device wafer and cap wafer.

In an embodiment, the method may further include forming a first electrical interconnect on a first cap surface of the cap wafer and in electrical contact with the at least one first interconnect.

In an embodiment, forming the first electrical interconnect may include forming the first electrical interconnect such that the first electrical interconnect may be configured to route the at least one first interconnect along the first cap surface of the cap wafer to crossing the conformal sealing ring to the outside of the sealed environment.

In an embodiment, the method may further include forming at least one second interconnect between the device wafer and the cap wafer such that the at least one second interconnect may be configured to provide an electrical connection between the device wafer and the cap wafer.

In an embodiment, forming the at least one second interconnect may include forming the at least one second interconnect within the conformal sealing ring.

In an embodiment, forming the at least one first interconnect and forming the at least one second interconnect may include forming the at least one first interconnect on one side of the MEMS device and forming the at least one second interconnect on another side of the MEMS device.

In an embodiment, the method may further include forming a second electrical interconnect on the cap wafer and in electrical contact with the at least one second interconnect.

In an embodiment, forming the second electrical interconnect may include forming the second electrical interconnect such that the second electrical interconnect may be configured to route the at least one second interconnect along the first cap surface of the cap wafer to crossing the conformal sealing ring to the outside of the sealed environment.

In an embodiment, the conformal sealing ring may be made of a conformal material which may provide a conformal bonding.

In an embodiment, wherein each of the at least one first interconnect and the at least one second interconnect may be made of the same conformal material as the conformal sealing ring.

In an embodiment, the conformal material may be selected from a group of materials consisting of gold-tin alloy, frit glass, polymer.

In an embodiment, forming the conformal sealing ring, the at least one first interconnect and the at least one second interconnect may include forming the conformal sealing ring, the at least one first interconnect and the at least one second interconnect in a common processing step.

In an embodiment, forming the at least one first interconnect and the at least one second interconnect may include forming the at least one first interconnect and the at least one second interconnect such that the at least one first interconnect may be electrically isolated from the conformal sealing ring and the at least one second interconnect may be electrically isolated from the conformal sealing ring.

In an embodiment, the method may further include forming at least one third interconnect between the device wafer and the cap wafer.

In an embodiment, forming the at least one third interconnect may include forming the at least one third interconnect outside of the conformal sealing ring.

In an embodiment, forming the second electrical interconnect may include forming the second electrical interconnect such that the second electrical interconnect may electrically connect the at least one second interconnect to the at least one third interconnect.

In an embodiment, the method may further include forming a third electrical interconnect disposed on the device wafer and electrically connect the at least one third interconnect to an external connection.

In an embodiment, the method may further include forming a first through via in the cap wafer.

In an embodiment, the method may further include forming a fourth electrical interconnect in the first through via and in electrical contact with the first electrical interconnect so as to electrically connect the first electrical interconnect to an external connection.

In an embodiment, the method may further include forming a second through via in the cap wafer.

In an embodiment, the method may further include forming a fifth electrical interconnect in the second through via and in electrical contact with the second electrical interconnect so as to electrically connect the second electrical interconnect to an external connection.

In an embodiment, forming the conformal sealing ring may include forming the conformal sealing ring such that the conformal sealing ring may be connected to a ground connection.

In an embodiment, the conformal sealing ring may be connected to a ground pad interconnect.

In an embodiment, the conformal sealing may be connected to the ground pad interconnect through a small opening made in a dielectric layer, the small opening positioned between the sealing ring and the ground pad interconnect.

In an embodiment, in wafer level vacuum packaging for MEMS devices, the device wafer or MEMS wafer is bonded with a cap wafer. To improve the performance of some of the MEMS devices, vacuum may be required inside the package. To maintain the vacuum inside the package, a seal ring may be formed surrounding the MEMS device. During wafer bonding, the seal ring on the cap wafer and the MEMS wafer may get aligned and bonded together to achieve a vacuum seal. As an example, the MEMS device may include bond pads or device pads of the MEMS device inside the seal ring. Further, if the MEMS device may be formed on a SOI substrate, the device pads may also be isolated from the bottom support substrate. Hence the device pads may not redistribute to outside of the seal ring. One way that the device pads may be brought into the outside of the seal ring may be through the cap wafer. Hence identical pads may be formed on the cap wafer which may be aligned to the device pads of the MEMS wafer. During bonding between the cap wafer and the MEMS wafer, the respective pads of cap wafer and the MEMS wafer may be bonded and the contact may be formed with the MEMS device. In this regard, the pads from the cap wafer may be redistributed outside of the seal ring by wiring through underneath the seal ring. By this way the MEMS device may be connected to the outside world and at the same time the vacuum seal may be maintained. The way that the pads may be redistributed from inside the seal ring of the package to the outside through the seal ring may be known as a lateral feed through. Another method may be to form through silicon via (TSV) on the cap wafer which can be contacted directly from the pads of the MEMS device or from the distributed pads outside the seal ring. Connecting the device pads to the outside of the seal ring via TSV approach may be known as a vertical feed through. A combination of the lateral feed through and the vertical feed through may be used to connect the device pads of the MEMS device from within the seal ring to outside of the seal ring.

In an embodiment, a wafer level package with lateral feed through from the cap wafer bonded with the MEMS wafer may be disclosed. In the wafer level package, lateral feed through from the cap wafer may be used to connect the device pads of the MEMS wafer. The pads connecting the cap wafer with the device pads on the MEMS wafer may be bonded with solder for electrical interconnection.

The method of lateral feed through interconnection from the cap wafer may be used for MEMS devices which may include isolated pads within the device substrate. Since the substrate used for making MEMS device may be on a Silicon On Insulator (SOI) substrate including a bottom support substrate, an insulating layer, for example a buried oxide (BOX) layer disposed on the bottom support substrate and a device substrate disposed on the insulating layer, the device pads of the MEMS devices may be electrically isolated from the bottom support substrate. The MEMS devices which may include device pads for electrical connection may be electrically isolated from the device substrate by forming trenches along the pads periphery. The trenches along the periphery of the device pads may be made until it may open the buried oxide layer of the substrate. The trenches formed on the periphery of the pads may be deposited with thermal oxide to further isolate the device pads from the device substrate. MEMS devices which may include isolated pads with trenches may not be able to redistribute the device pads to outside the seal ring due to the trenches.

MEMS devices may require hermetic sealing to protect the MEMS device from moisture. However some devices may require more stringent requirement such as vacuum to improve the performance of the device. If the MEMS device may be a moving structure, the vacuum ambient may reduce the damping of the moving structure due to air resistance.

Since vacuum and hermeticity may be required inside the package, a tight sealing may be required within the MEMS device.

In an embodiment, a solder based sealing may be disclosed, using AuSn solder. Au and Sn layers may be deposited by E-beam evaporation method on the MEMS wafer and the cap wafer to form the seal ring and the electrical interconnection. Since Sn may be deposited on the either sides of the wafer, the bonding of the respective MEMS wafer and the cap wafer may be possible at a lower temperature of about 280° C. During the bonding, the seal ring portion and the pads of the cap wafer may be bonded with the seal ring portion and the device pads of the MEMS wafer. Since solder may be used for bonding, the coplanarity issue due to wafer warpage and the TTV variation on the respective MEMS wafer and the cap wafer may be overcome with an additional bond force.

In an embodiment, the MEMS wafer and the cap wafer may be bonded together using AuSn solder. During bonding, the solder deposited on the seal ring and bond pads may be joined together. The bonding may be done in high vacuum condition. Before bonding, the MEMS wafer and the cap wafer may be prebaked to reduce the outgassing after bonding. The next process may be to dice the bonded wafer. The dicing of the lateral feed through wafer may require a unique method which may include half dicing on the precut made on the MEMS wafer. This half dicing may be required to expose the bond pads made by the lateral feed through connection. If half dicing and full dicing may be done on the same side of the wafer, silicon debris may float on the respective MEMS wafer and cap wafer and this may damage the dicing blade. This effect may be more prevalent when the dice may be large. To avoid the floating of the silicon debris during dicing, a method may be proposed during the lateral feed through development. In this method, one of the wafers or one portion of the wafer level package may be mounted on the dicing machine and the half cut dicing may be made first from the wafer which may include precut etching. After dicing, the precut side of the wafer may be remounted from a dicing tape and mounted again by facing the non-precut side of the bonded wafer. The wafer may be diced fully on both x and y passes to separate the die. During this process, the precut portion of the bonded wafer may stick onto the dicing tape while removing the wafer bonded chip from the dicing tape. By this method, the debris may not float during dicing and may stick on to the dicing tape. For mounting of the wafer, the dicing tape, for example an UV tape may be used to ease the mounting and demounting of the wafer.

The bonding temperature used for the method of bonding may be about 280° C. which may be relatively low. A lower bonding temperature may be attained due to the bonding between the Sn layers on both sides or on one side of the wafers as the melting point of Sn may be about 220 to 230° C. Therefore, the bonding temperature may be about 30° C. to 40° C. higher than the melting temperature of Sn.

FIG. 1 shows a cross-sectional view of a wafer level package 102 according to an embodiment. The wafer level package 102 may include a device wafer 104 including a MEMS device 106, a cap wafer 108 disposed over the device wafer 104, at least one first interconnect 110 disposed between the device wafer 104 and the cap wafer 108 and configured to provide an electrical connection between the device wafer 104 and the cap wafer 108 and a conformal sealing ring 112 disposed between the device wafer 104 and the cap wafer 108 and configured to surround the at least one first interconnect 110 and the MEMS device 106 so as to provide a conformally sealed environment for the at least one first interconnect 110 and the MEMS device 106. The conformal sealing ring 112 may be configured to conform to a respective suitable surface of the device wafer 104 and the cap wafer 108 when the device wafer 104 may be bonded to the cap wafer 108.

In an embodiment, the device wafer 104 may include a silicon on insulator (SOI) substrate. The SOI substrate may include a support layer 114, an insulator layer 116 disposed on the support layer 114 and a device layer 118 disposed on the insulator layer 116. The device layer 118 may be electrically insulated from the support layer 114 by the insulator layer 116. The support layer 114 may include silicon, sapphire, polysilicon, silicon oxide, silicon nitride for example. The insulator layer 116 may include silicon oxide, polymer, dielectric material for example. The device layer 118 may include silicon, gallium arsenide, silicon-germanium for example.

In an embodiment, the MEMS device 106 may be formed on the device layer 118 of the device wafer 104. The MEMS device 106 in FIG. 1 may include a resonator beam but may not be so limited.

In an embodiment, the cap wafer 108 may serve to protect the MEMS device 106 and may include silicon, polymer, thermoplastic, silicon carbide (SiC), ceramic, glass, metal, printed circuit board (PCB), for example.

The device wafer 104 may include two opposing surfaces, a first device surface 120 and a second device surface 122. Similarly, the cap wafer 108 may include two opposing surfaces, a first cap surface 124 and a second cap surface 126. The first device surface 120 and the first cap surface 124 may be the respective active surfaces of the device wafer 104 and the cap wafer 108, while the second device surface 122 and the second cap surface 126 may be the respective passive surfaces of the device wafer 104 and the cap wafer 108. The first device surface 120 may face towards the first cap surface 124 and the second device surface 122 may face away from the second cap surface 126 when the respective device wafer 104 and the cap wafer 108 may be bonded together.

The wafer level package 102 may further include a first electrical interconnect 132 disposed on the first cap surface 124 of the cap wafer 108 and in electrical contact with the at least one first interconnect 110. The first electrical interconnect 132 may be configured to route the at least one first interconnect 110 along the first cap surface 124 of the cap wafer 108 to crossing the conformal sealing ring 112 to the outside of the sealed environment. The first electrical interconnect 132 may route the at least one first interconnect 110 to a first external bonding pad 134 disposed on the cap wafer 108. The first external bonding pad 134 may be further coupled to a first further external bonding pad 136 on a further substrate 138, for example a printed circuit board (PCB) by a wire bond for example. The first further external bonding pad 136 may be positioned on any suitable position on the further substrate 138 depending on user and design requirements.

The wafer level package 102 may further include at least one second interconnect 140 disposed between the device wafer 104 and the cap wafer 108 and configured to provide an electrical connection between the device wafer 104 and the cap wafer 108. The at least one second interconnect 140 may be disposed within the conformal sealing ring 112.

The at least one first interconnect 110 may be disposed on one side of the MEMS device 106 and the at least one second interconnect 140 may be disposed on another side of the MEMS device 106. The at least one first interconnect 110 and the at least one second interconnect 140 may be positioned at any suitable position relative to the MEMS device 106 depending on user and design requirements.

The wafer level package 102 may further include a second electrical interconnect 142 disposed on the cap wafer 108 and in electrical contact with the at least one second interconnect 140. The second electrical interconnect 142 may be configured to route the at least one second interconnect 140 along the first cap surface 124 of the cap wafer 108 to crossing the conformal sealing ring 112 to the outside of the sealed environment. The second electrical interconnect 142 may be further coupled to a second external bonding pad (not shown) disposed on the cap wafer 108. The second external bonding pad may be further coupled to a second further external bonding pad (not shown) on the further substrate 138 by a wire bond for example. The first further external bonding pad 136 and the second further external bonding pad may be disposed on the further substrate 138 on a same side of the MEMS device 106 or may be respectively disposed on the further substrate 138 on opposite sides of the MEMS device 106. The position of the first further external bonding pad 136 and the second further external bonding pad may vary depending on user and design requirements.

The wafer level package 102 may include a plurality of bonding pads 144 formed on the respective first device surface 120 and the first cap surface 124 of the device wafer 104 and the cap wafer 108. On the first device surface 120 of the device wafer 104, the bonding pads 144 may be disposed on the positions where the respective conformal sealing ring 112, the at least one first interconnect 110 and the at least one second interconnect 140 may be coupled to the device wafer 104. Similarly, on the first cap surface 124 of the cap wafer 108, the bonding pads 144 may be disposed on the positions where the respective conformal sealing ring 112, the at least one first interconnect 110 and the at least one second interconnect 140 may be coupled to the cap wafer 108.

Further on the first device surface 120 of the device wafer 104, the bonding pads 144 on one side of the MEMS device 106 which correspond to the respective at least one first interconnect 110 and the conformal sealing ring 112 may be electrically isolated from each other by a trench 146 formed in the device wafer 104. The bonding pads 144 may be further electrically isolated by a device dielectric layer 148 disposed on the device layer 118 of the device wafer 104 and in the trench 146 formed in the device wafer 104. Also on the first device surface 120 of the device wafer 104, the bonding pads 144 on an opposite side of the MEMS device 106 which correspond to the respective at least one second interconnect 140 and the conformal sealing ring 112 may also be electrically isolated from each other by a further trench 150 formed in the device wafer 104. The bonding pads 144 may also be further electrically isolated by the device dielectric layer 148 disposed on the device layer 118 of the device wafer 104 and in the further trench 150 formed in the device wafer 104.

In an embodiment, the wafer level package 102 may include a plurality of under bump metallurgic (UBM) structures 152 disposed on the respective bonding pads 144 on the first device surface 120 and the first cap surface 124. Each of the respective UBM structure 152 may be disposed over each bonding pad 144 and positioned between each bonding pad 144 and each of the respective conformal sealing ring 112, the at least one first interconnect 110 and the at least one second interconnect 140. Each UBM structure 152 may include a stacked layer arrangement including a plurality of layers stacked above one another. Each UBM structure 152 may include any suitable number of layers stacked above one another. The layers may include materials such as Titanium (Ti), Platinum (Pt), Nickel (Ni). Each UBM structure 152 may also include any suitable combination of layers of materials.

In FIG. 1, the conformal sealing ring 112 may be disposed between the respective UBM structures 152 on the first device surface 120 and the first cap surface 124. The conformal sealing ring 112 may be made of a conformal material which may provide a conformal bonding. Each of the at least one first interconnect 110 and the at least one second interconnect 140 may also be disposed between the respective UBM structures 152 on the first device surface 120 and the first cap surface 124. Each of the at least one first interconnect 110 and the at least one second interconnect 140 may be made of the same conformal material as the conformal sealing ring 112. The conformal material may be selected from a group of materials consisting of solder for example gold-tin alloy, conductive film, adhesive, frit glass, polymer. The conformal sealing ring 112, the at least one first interconnect 110 and the at least one second interconnect 140 may be formed in a common processing step. Alternatively, each of the at least one first interconnect 110 and the at least one second interconnect 140 may be of a different material from the conformal sealing ring 112. Even further, each of the at least one first interconnect 110 and the at least one second interconnect 140 may be of a same or a different material. Each of the at least one first interconnect 110 and the at least one second interconnect 140 may be of any electrically conductive material.

The wafer level package 102 may include a cap dielectric layer 154 disposed on the first cap surface 124 of the cap wafer 108. The respective first electrical interconnect 132 and the second electrical interconnect 142 may be electrically isolated from the cap wafer 108 by the cap dielectric layer 154. Further the first electrical interconnect 132 and the second electrical interconnect 142 may also be electrically isolated from each other by the cap dielectric layer 154.

The wafer level package 102 may include a first electrical interconnect dielectric layer 156 disposed between the conformal sealing ring 112 and the first electrical interconnect 132. The first electrical interconnect dielectric layer 156 may serve to electrically isolate the conformal sealing ring 112 from the first electrical interconnect 132. The wafer level package 102 may also include a second electrical interconnect dielectric layer 158 disposed between the conformal sealing ring 112 and the second electrical interconnect 142. The second electrical interconnect dielectric layer 158 may serve to electrically isolated the conformal sealing ring 112 from the second electrical interconnect 142.

The presence of the respective first electrical interconnect dielectric layer 156 and the second electrical interconnect dielectric layer 158 may serve to allow the at least one first interconnect 110 to be electrically isolated from the conformal sealing ring 112 and to also allow the at least one second interconnect 140 to be electrically isolated from the conformal sealing ring 112.

In an embodiment, the device dielectric layer 148, the cap dielectric layer 154, the first electrical interconnect dielectric layer 156 and the second electrical interconnect dielectric layer 158 may be an insulating material, for example silicon oxide ($SiO_2$). Further each of the device dielectric layer 148, the cap dielectric layer 154, the first electrical interconnect dielectric layer 156 and the second electrical interconnect dielectric layer 158 may be of the same material or of a different material.

Figure 2:
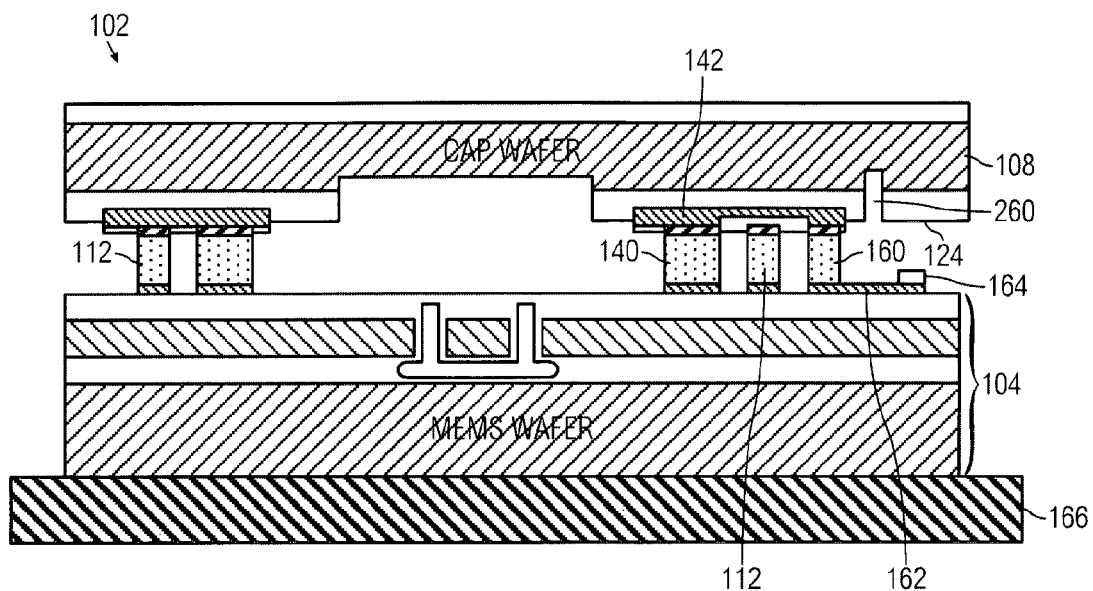
FIG. 2 shows a cross-sectional view of a wafer level package with at least one third interconnect disposed outside of a conformal sealing ring according to an embodiment.

FIG. 2 shows a cross-sectional view of a wafer level package 102 with at least one third interconnect 160 disposed outside of a conformal sealing ring 112 according to an embodiment.

FIG. 2 is similar to FIG. 1 except for the at least one third interconnect 160 disposed outside of the conformal sealing ring 112 and a precut 260 formed on the first cap surface 124 of the cap wafer 108.

The wafer level package 102 may include the at least one third interconnect 160 disposed between the device wafer 104 and the cap wafer 108 and the at least one third interconnect 160 may be disposed outside of the conformal sealing ring 112. The second electrical interconnect 142 may electrically connect the at least one second interconnect 140 to the at least one third interconnect 160.

The wafer level package 102 may further include a third electrical interconnect 162 disposed on the device wafer 104 and electrically connect the at least one third interconnect 160 to an external connection. The at least one second interconnect 140 may be routed via the second electrical interconnect 142, the at least one third interconnect 160 and the third electrical interconnect 162 to a third external bonding pad 164 disposed on the device wafer 104.

In FIG. 2, the wafer level package 102 may be positioned on an intermediate support substrate 166, for example a dicing tape.

Figure 3:
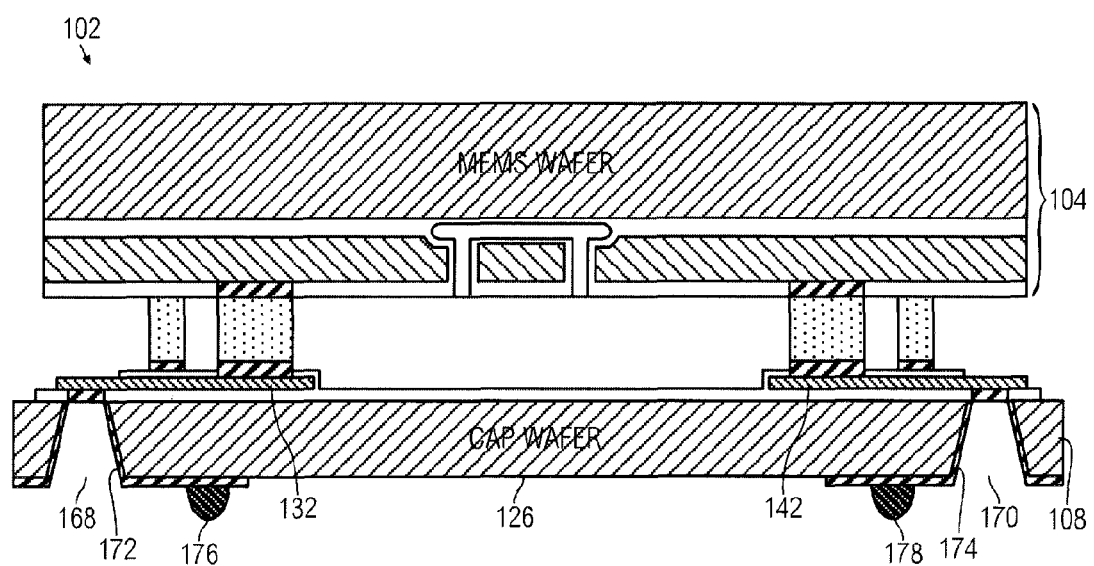
FIG. 3 shows a cross-sectional view of a wafer level package with a first through via and a second through via formed in a cap wafer according to an embodiment.

FIG. 3 shows a cross-sectional view of a wafer level package 102 with a first through via 168 and a second through via 170 formed in a cap wafer 108 according to an embodiment.

FIG. 3 is similar to FIG. 1 except for the first through via 168 and the second through via 170 formed in a cap wafer 108. In addition, no pre-cut may be formed on the device wafer 104. The cap wafer 108 may be similar to that in FIG. 1 except for the pad distribution. The first through via 168 and the second through via 170 may be formed either before bonding of the cap wafer 108 with the device wafer 104 or after bonding with the device wafer 104. One likely advantage of this wafer level package 102 may be that the package form factor may be smaller than that in FIG. 1 by about 30% to 40%, the precut on the device wafer 104 may be avoided and dicing of the precut location may be avoided.

The wafer level package 102 may include the first through via 168 formed in the cap wafer 108 and a fourth electrical interconnect 172 disposed in the first through via 168 and in electrical contact with the first electrical interconnect 132 so as to electrically connect the first electrical interconnect 132 to an external connection. The wafer level package 102 may include the second through via 170 formed in the cap wafer 108 and a fifth electrical interconnect 174 disposed in the second through via 170 and in electrical contact with the second electrical interconnect 142 so as to electrically connect the second electrical interconnect 142 to an external connection.

The fourth electrical interconnect 172 may be coupled to a fourth external bonding pad 176 disposed on the second cap surface 126 of the cap wafer 108. The fifth electrical interconnect 174 may be coupled to a fifth external bonding pad 178 disposed on the second cap surface 126 of the cap wafer 108. The fourth external bonding pad 176 may be the same as the fifth external bonding pad 178 and may include a solder ball. The fourth external bonding pad 176 and the fifth external bonding pad 178 may be configured for external connection to a further package or device for example.

In an embodiment, the first through via 168 and the second through via 170 may include through via formed through the cap wafer 108.

Figure 4A:
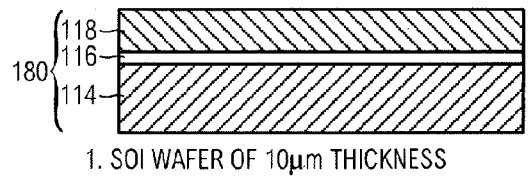
FIGS. 4A to 4H show cross-sectional views illustrating a method of forming a resultant device wafer including a MEMS device according to an embodiment.

FIGS. 4A to 4H show cross-sectional views illustrating a method of forming a resultant device wafer 198 including a MEMS device 106 according to an embodiment. FIG. 4A shows a starting device wafer 180. The starting device wafer 180 may include a SOI substrate or SOI wafer including a support layer 114, an insulator layer 116 disposed on the support layer 114 and a device layer 118 disposed on the insulator layer 116. The SOI substrate may include a thickness of about 10 μm.

Figure 4E:
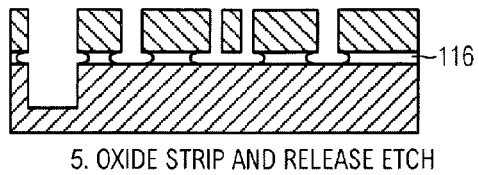
Figure 4B:
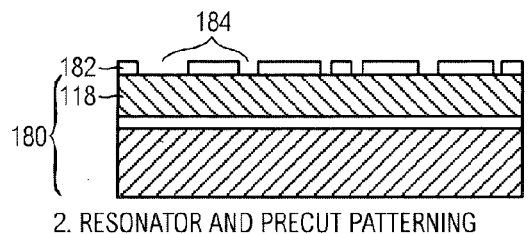

In FIG. 4B, resonator and precut patterning may be carried out. A dielectric layer 182 may be deposited on the device layer 118 of the SOI substrate 180 and a plurality of openings 184 corresponding to the resonator and the precut pattern may be formed on the dielectric layer 182.

Figure 4F:
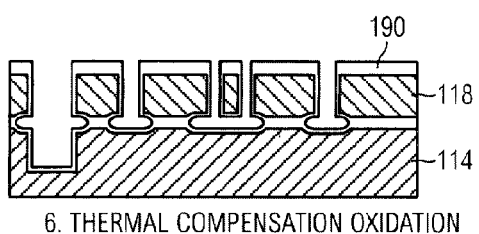
Figure 4C:
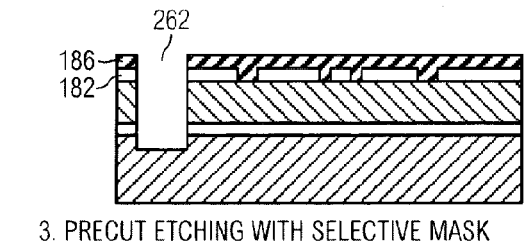

In FIG. 4C, precut etching with selective mask may be carried out. A photoresist layer 186 or masking layer may be deposited on the dielectric layer 182. The precut 262 may be formed by etching with the selective mask.

Figure 4G:
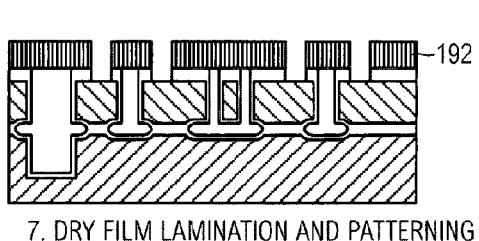
Figure 4D:
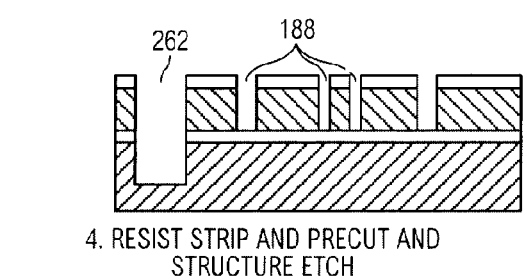

In FIG. 4D, resist strip as well as precut and structure etch may be carried out. The photoresist layer 186 may be stripped. Further, the precut 262 may be further etched and a plurality of vias 188 may be formed by the structure etch.

In FIG. 4E, oxide strip and release etch may be carried out. The dielectric layer 182 may be removed and some portions of the insulator layer 116 may be etched.

In FIG. 4F, thermal compensation oxidation may be carried out. Portions of the device layer 118 and the support layer 114 may be oxidised to form a oxide layer 190.

In FIG. 4G, dry film lamination and patterning may be carried out. A layer of dry film 192 may be deposited and a pattern may be formed in the layer of dry film 192.

Figure 4H:
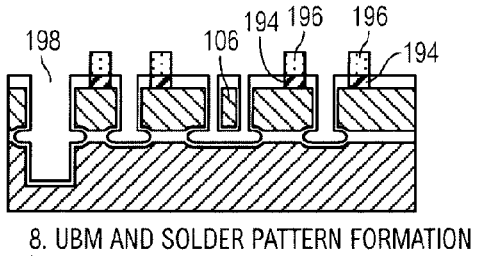

In FIG. 4H, UBM and solder pattern formation may be carried out. The respective device intermediate UBM structures 194 may be deposited and device intermediate solder portions 196 may be deposited on the respective device intermediate UBM structures 194. FIG. 4H shows a resultant device wafer 198 including the MEMS device 106.

FIGS. 5A to 5G show cross-sectional views illustrating a method of forming a resultant cap wafer 214 according to an embodiment.

Figure 5A:
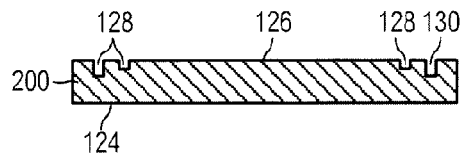
FIGS. 5A to 5G show cross-sectional views illustrating a method of forming a resultant cap wafer according to an embodiment.

FIG. 5A shows a starting cap wafer 200 having a first cap surface 124 and a second cap surface 126. Backside alignment marks 128 and dicing lines 130 may be formed on the second cap surface 126 of the starting cap wafer 200.

Figure 5E:
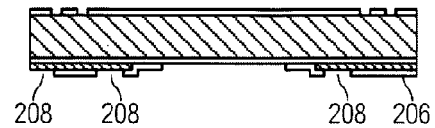
Figure 5B:
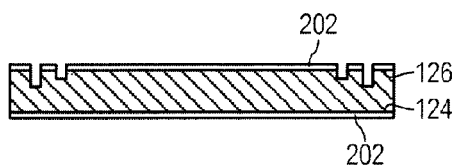

FIG. 5B shows oxide deposition on each of the first cap surface 124 and the second cap surface 126. A first layer of oxide 202, for example silicon oxide ($SiO_2$) of about 1 μm thickness may be deposited on each of the first cap surface 124 and the second cap surface 126.

Figure 5F:
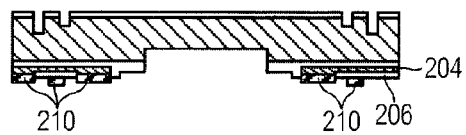
Figure 5C:
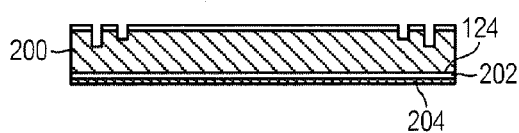

FIG. 5C shows pad metal deposition. A layer of pad metal 204 may be deposited on the first layer of oxide 202 on the first cap surface 124 of the starting cap wafer 200. The layer of pad metal 204 may be any conductive material and may include any suitable dimensions and thickness.

Figure 5G:
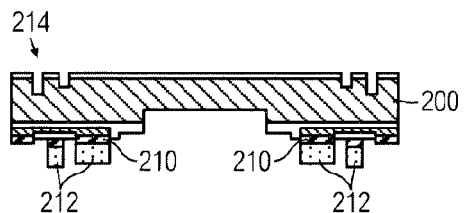
Figure 5D:
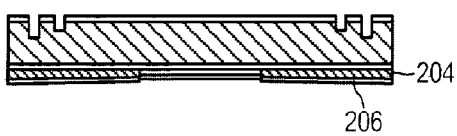

FIG. 5D shows oxide deposition on the layer of pad metal 204. A second layer of oxide 206, for example silicon oxide ($SiO_2$) may be deposited on the layer of pad metal 204.

FIG. 5E shows formation of oxide opening. Three openings 208 may be formed on the second layer of oxide 206. However, the number of openings 208 may vary depending on user and design requirements.

FIG. 5F shows UBM deposition as well as patterning and cavity etch. Five respective cap intermediate UBM structures 210 may be deposited. However, the number of cap intermediate UBM structures 210 may vary depending on user and design requirements. Three cap intermediate UBM structures 210 may be positioned in the respective three openings 208, in contact with the layer of pad metal 204 and two other cap intermediate UBM structures 210 may be positioned on the second layer of oxide 206, thereby electrically isolated from the layer of pad metal 204.

FIG. 5G shows solder deposition and lift-off. A dry film (not shown) may deposited over the cap wafer 200 and the respective cap intermediate UBM structures 210. A plurality of openings may be created in the dry film, each opening corresponding to each of the five cap intermediate UBM structures 210. Cap intermediate solder portions 212 may be deposited over each of the five cap intermediate UBM structures 210 in the respective openings. After the deposition of the cap intermediate solder portions 212, the dry film may be removed or stripped (i.e. lift-off) from the cap wafer 200. FIG. 5G shows a resultant cap wafer 214.

Figure 6A:
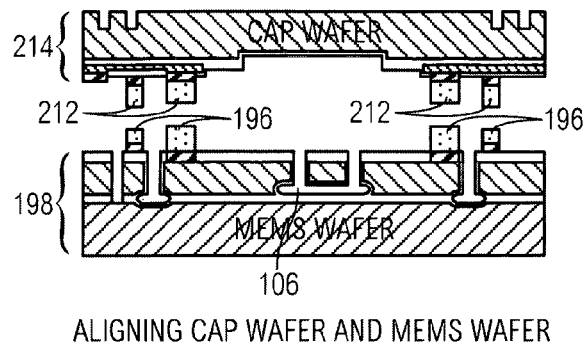
FIGS. 6A to 6C show cross-sectional views illustrating a method of bonding the resultant cap wafer as shown in FIG. 5G onto the resultant device wafer including the MEMS device as shown in FIG. 4H according to an embodiment.
Figure 6B:
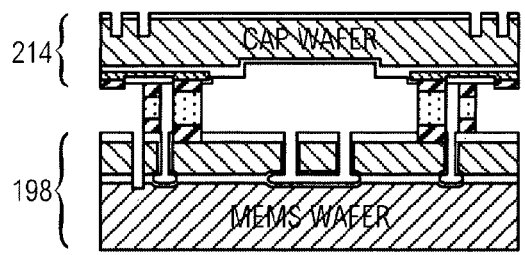
Figure 6C:
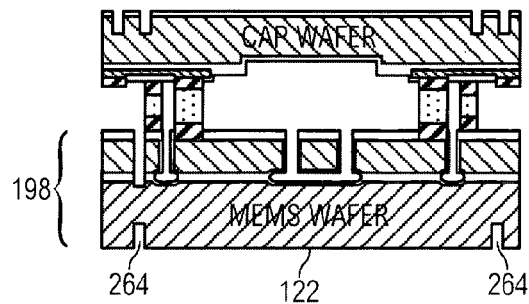

FIGS. 6A to 6C show cross-sectional views illustrating a method of bonding the resultant cap wafer 214 as shown in FIG. 5G onto the resultant device wafer 198 including the MEMS device 106 as shown in FIG. 4H according to an embodiment.

FIG. 6A show the aligning of the resultant cap wafer 214 as shown in FIG. 5G onto the resultant device wafer 198 including the MEMS device 106 as shown in FIG. 4H. In FIG. 6A, the respective cap intermediate solder portions 212 on the resultant cap wafer 214 and the device intermediate solder portions 196 and the resultant device wafer 198 may be aligned.

FIG. 6B shows wafer vacuum bonding may be carried out. The resultant cap wafer 214 may be bonded to the resultant device wafer 198. The bonding temperature may be about 280 degC. and the vacuum level during bonding may be about 7 micro torr. The aligned resultant cap wafer 214 and the resultant device wafer 198 may be kept inside a bonding chamber at the above-mentioned vacuum condition at room temperature for about 9 hours, for example, to remove any possible outgassing gases. After about 9 hours, the respective resultant cap wafer 214 and the resultant device wafer 198 may be bonded together using a wafer bonder which may provide a step controlled bond force and at the vacuum bonding pressure of about 7 micro torr, the full bond force of 30 kn may be applied. Duration of the vacuum pumping down during wafer bonding may depend on the wafer processing purity and the outgassing, baking for example. So the duration of 9 hours may only be an example and the bond force may also depend on the chip size, seal ring, wafer size for example. The force and the vacuum pumping hours may be limited to only for the device wafer and the cap wafer mentioned in the current embodiment. Force may depend on the number of chips in a wafer, seal ring dimension. However vacuum pumping down time may not be limited.

FIG. 6C shows formation of two backside precut alignment marks 264 on the resultant device wafer 198. Two precut alignment marks 264 may be formed on the backside or the second device surface 122 of the resultant device wafer 198.

FIG. 7A to 7E show cross-sectional views illustrating a method of dicing the bonded device wafer 104 and cap wafer 108 according to an embodiment.

Figure 7A:
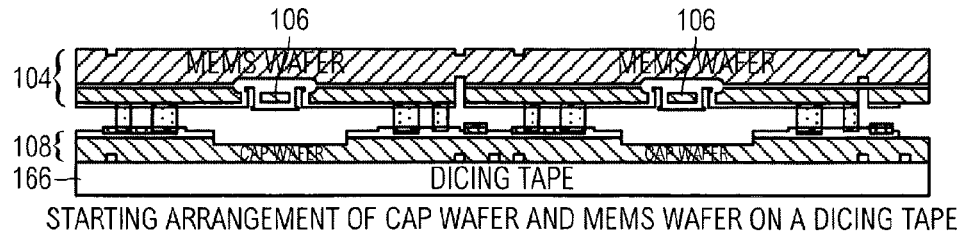
FIGS. 7A to 7E show cross-sectional views illustrating a method of dicing the bonded device wafer and cap wafer according to an embodiment.

FIG. 7A shows a starting arrangement of a cap wafer 108 and a device wafer 104 supported on an intermediate support substrate 166, for example a dicing tape. The cap wafer 108 may be in contact with the dicing tape 166. As an illustration, two MEMS devices 106 may be formed in the device wafer 104 but the number of MEMS device 106 may vary according to design and user requirements.

Figure 7B:
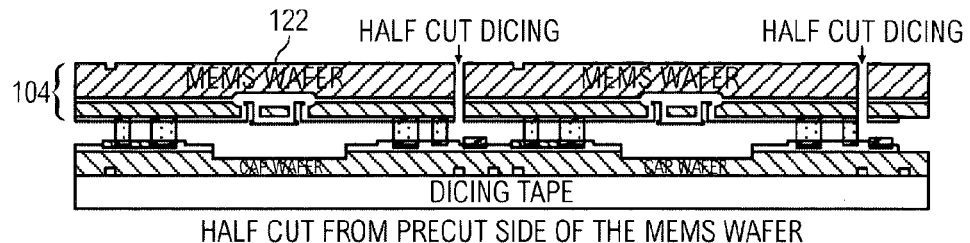

In FIG. 7B, a half cut from a precut side or the second device surface 122 of the device wafer 104 may be carried out. The half cut dicing may be shown by the arrows as shown in FIG. 7B.

Figure 7C:
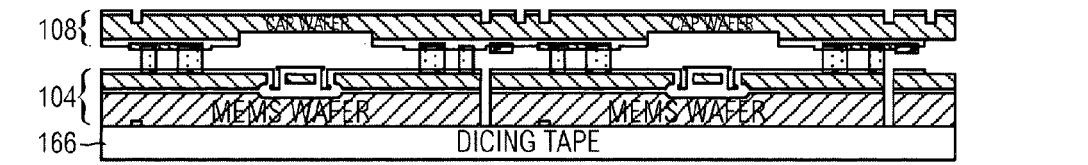

In FIG. 7C, the arrangement of the cap wafer 108 and the device wafer 104 may be turned over or flipped and remounted on the dicing tape 166. The device wafer 104 may now be in contact with the dicing tape 166.

Figure 7D:
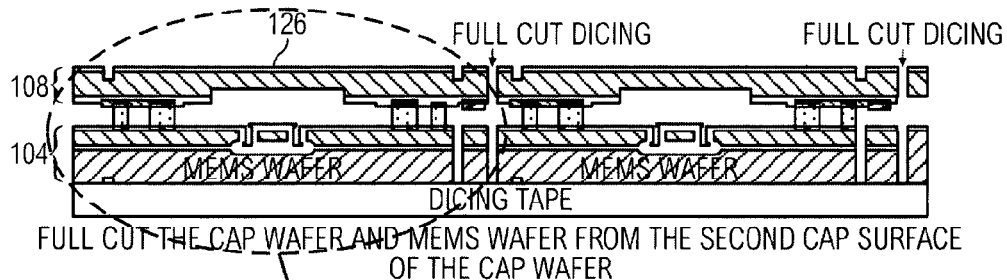

In FIG. 7D, a full cut of the cap wafer 108 and the device wafer 104 from the second cap surface 126 of the cap wafer 108 may be carried out.

Figure 7E:
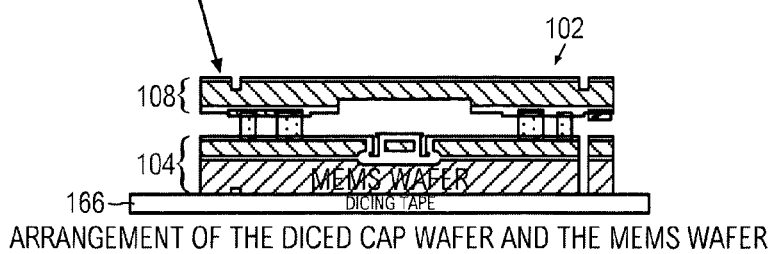

FIG. 7E shows a wafer level package 102 including each diced cap wafer 108 and the device wafer 104 on the dicing tape 166.

Figure 8A:
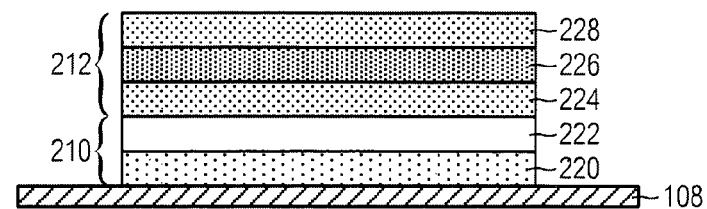
FIG. 8A shows a cross-sectional view of a solder composition of a first intermediate solder layer disposed on a cap wafer before bonding according to an embodiment.

FIG. 8A shows a cross-sectional view of a solder composition of a cap intermediate solder portion 212 disposed on a cap wafer 108 before bonding according to an embodiment. FIG. 8A shows a cap intermediate UBM structure 210 disposed on the cap wafer 108 and the cap intermediate solder portion 212 disposed on the cap intermediate UBM structure 210. The cap intermediate UBM structure 210 may include two layers, for example a titanium (Ti) layer 220 and a nickel (Ni) layer 222 disposed on the Ti layer 220. The Ti layer 220 may be disposed on the cap wafer 108. The cap intermediate UBM structure 210 may include any suitable number of layers and any suitable combination of materials depending on user and design requirements. The cap intermediate solder portion 212 may include a gold (Au) layer 224, a tin (Sn) layer 226 disposed on the Au layer 224 and a further Au layer 228 disposed on the Sn layer 226. The further Au layer 224 may be deposited to inhibit oxygen penetration. The Au layer 224 may be disposed on the Ni layer 222. The Ti layer 220 may have a thickness of about 100 nm, the Ni layer 222 may have a thickness of about 100 nm, the Au layer 224 may have a thickness of about 2 µm, the Sn layer 226 may have a thickness of about 2 µm and the further Au layer 228 may have a thickness of about 50 nm. The thickness of the respective layers may vary depending on user and design requirements. The cap intermediate solder portion 212 may also include any other suitable combination of materials depending on user and design requirements.

Figure 8B:
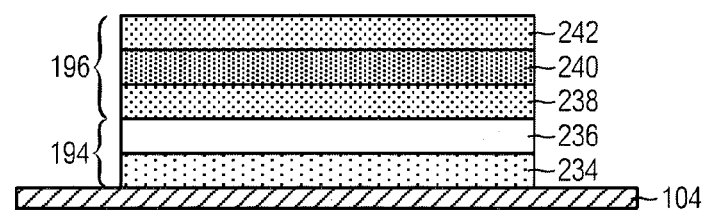
FIG. 8B shows a cross-sectional view of a solder composition of a second intermediate solder layer disposed on a device wafer before bonding according to an embodiment.

FIG. 8B shows a cross-sectional view of a solder composition of a device intermediate solder portion 196 disposed on a device wafer 104 before bonding according to an embodiment. FIG. 8B shows a device intermediate UBM structure 194 disposed on the cap wafer 108 and a device intermediate solder portion 196 disposed on the device intermediate UBM structure 194. The device intermediate UBM structure 194 may include two layers, for example a titanium (Ti) layer 234 and a platinum (Pt) layer 236 disposed on the Ti layer 234. The Ti layer 234 may be disposed on the device wafer 104. The device intermediate UBM structure 194 may include any suitable number of layers and any suitable combination of materials depending on user and design requirements. The device intermediate solder portion 196 may include a gold (Au) layer 238, a tin (Sn) layer 240 disposed on the Au layer 238 and a further Au layer 242 disposed on the Sn layer 240. The further Au layer 242 may be deposited to inhibit oxygen penetration. The Au layer 238 may be disposed on the Pt layer 236. The Ti layer 234 may have a thickness of about 100 nm, the Pt layer 236 may have a thickness of about 200 nm, the Au layer 238 may have a thickness of about 2 µm, the Sn layer 240 may have a thickness of about 2 µm and the further Au layer 242 may have a thickness of about 50 nm. The thickness of the respective layers may vary depending on user and design requirements. The device intermediate solder portion 196 may also include any other suitable combination of materials depending on user and design requirements.

Figure 8C:
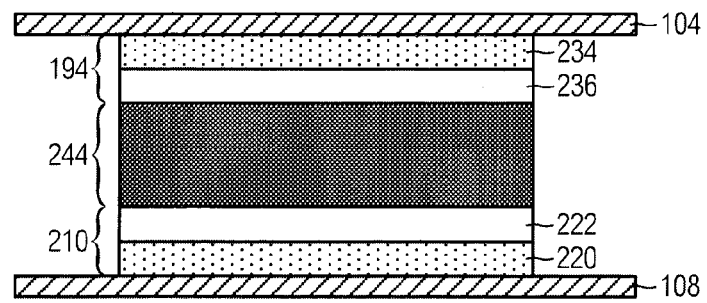
FIG. 8C shows a cross-sectional view of a solder composition of a solder layer between the cap wafer and the device wafer after bonding according to an embodiment.

FIG. 8C shows a cross-sectional view of a solder composition of a resultant solder layer 244 between the cap wafer 108 and the device wafer 104 after bonding according to an embodiment.

FIG. 8C shows a cap intermediate UBM structure 210, a resultant solder layer 244 and a device intermediate UBM structure 194 disposed between the cap wafer 108 and the device wafer 104. The cap intermediate UBM structure 210 may include two layers, for example a titanium (Ti) layer 220 disposed on the cap wafer 108 and a nickel (Ni) layer 222 disposed on the Ti layer 220. The resultant solder layer 244 may be a conformal material and include a combination of Au layer and Sn layer or a AuSn alloy. The device intermediate UBM structure 194 may include two layers, for example a platinum (Pt) layer 236 disposed on the resultant solder layer 244 and a titanium (Ti) layer 234 disposed on the Pt layer 236. The solder composition of the resultant solder layer 244 may be the same for each of the conformal sealing ring 112, at least one first interconnect 110, the at least one second interconnect 140 and the at least one third interconnect 160. Further, the resultant solder layer 244 may be conformed to any suitable surfaces when bonding.

In an embodiment, the cap intermediate solder portion 212 may not be present on the cap intermediate UBM structure 210 in FIG. 8A and only the device intermediate solder portion 196 may be present on the device intermediate UBM structure 194. Therefore, the device intermediate solder portion 196 may be the resultant solder layer 244 as shown in FIG. 8C. In a further embodiment, the device intermediate solder portion 196 may not be present on the device intermediate UBM structure 194 in FIG. 8B and only the cap intermediate solder portion 212 may be present on the cap intermediate UBM structure 210. Therefore, the cap intermediate solder portion 212 may be the resultant solder layer 244 as shown in FIG. 8C.

Figure 9:
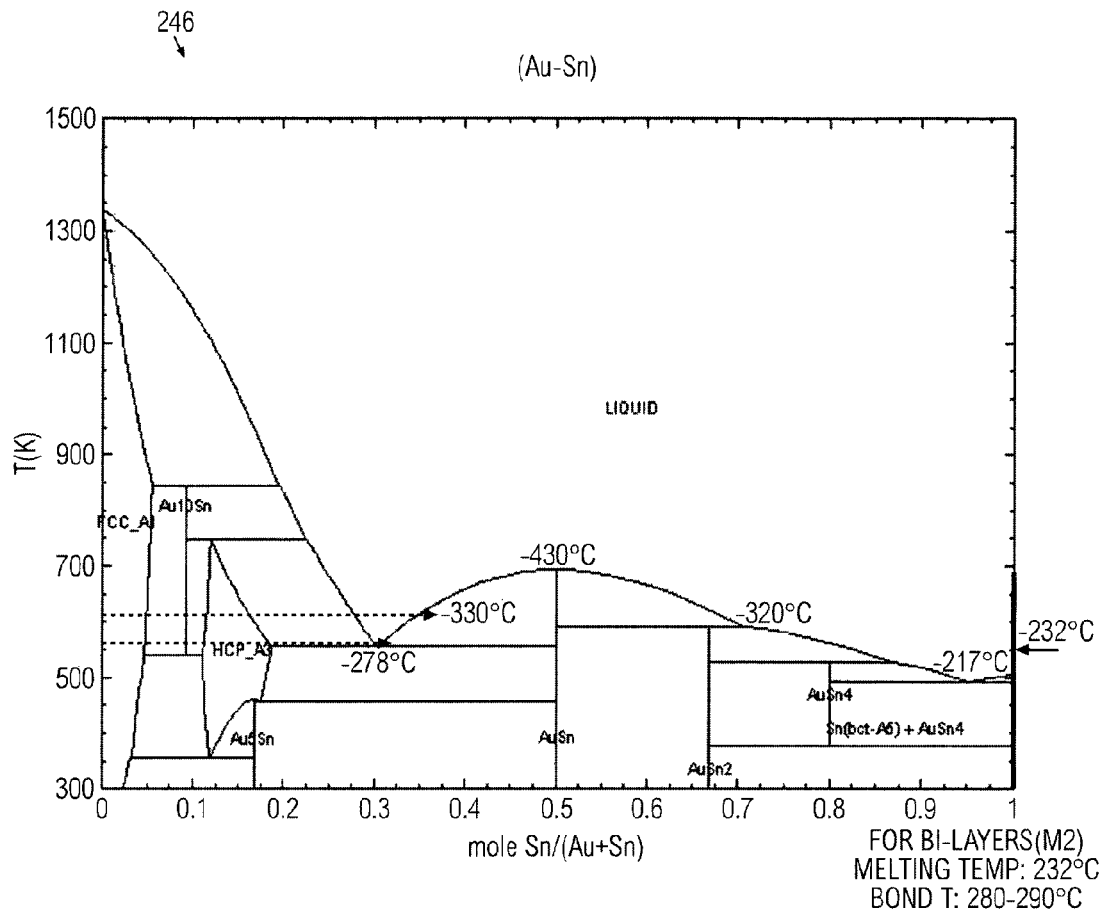
FIG. 9 shows a solder phase diagram of a resultant solder layer between a cap wafer and a device wafer according to an embodiment.

FIG. 9 shows a solder phase diagram 246 of a resultant solder layer 244 between a cap wafer 108 and a device wafer 104 according to an embodiment.

The solder phase diagram 246 shown in FIG. 9 may be a binary phase diagram of Au and Sn. Since the solder used here may be in the layer form, the composition of the resultant solder layer 244 may be a AuSn intermetallic compound (IMC) and the composition of the resultant solder layer 244 may not be controlled. The bonding temperature may be derived from the solder phase diagram 246 and may depend on the Sn layer which may be the layer in respective contact during bonding. The melting temperature of Sn may be about 232 degC. and the reflow temperature may be about 40 degC. to 50 degC. higher than the melting temperature and hence the bonding temperature may be optimized at about 280 degC.

In the lateral feed through connection, i.e., the first electrical interconnect 132 and the second electrical interconnect 142 may be used to connect the respective at least one first interconnect 110 and the at least one second interconnect 140 positioned within the conformally sealed environment to outside of the conformally sealed environment. On the top of the lateral feed through connection (i.e. the first electrical interconnect 132 and the second electrical interconnect 142), a respective first electrical interconnect dielectric layer 156 and a second electrical interconnect dielectric layer 158 may be deposited to isolate the respective lateral feed through connection from the respective UBM structure used for solder deposition (for forming of the conformal sealing ring 112). Using the example of the first electrical interconnect 132, a first electrical interconnect dielectric layer 156 may be disposed between the UBM structure 152 corresponding to the conformal sealing ring 112 and the first electrical interconnect 132. Each of the UBM structure 152 and the first electrical interconnect 132 may include metals. In this regard, two metals with a dielectric layer separation acts as a parasitic capacitor and may affect the Q factor of the MEMS device 106. One way to reduce the dependence of the parasitic effect with a change in frequency may be to connect a ground lateral feed through with the conformal sealing ring 112. This may be carried out by creating an opening in the first electrical interconnect dielectric layer 156 (or oxide layer) (somewhere away from the first electrical interconnect 132) and connecting the conformal sealing ring 112 to a ground connection. In this manner, a localized grounding of the MEMS device 106 ground may be made with the conformal sealing ring 112 rather than grounding the whole conformal sealing ring 112 with the MEMS device 106 body.

Figure 10:
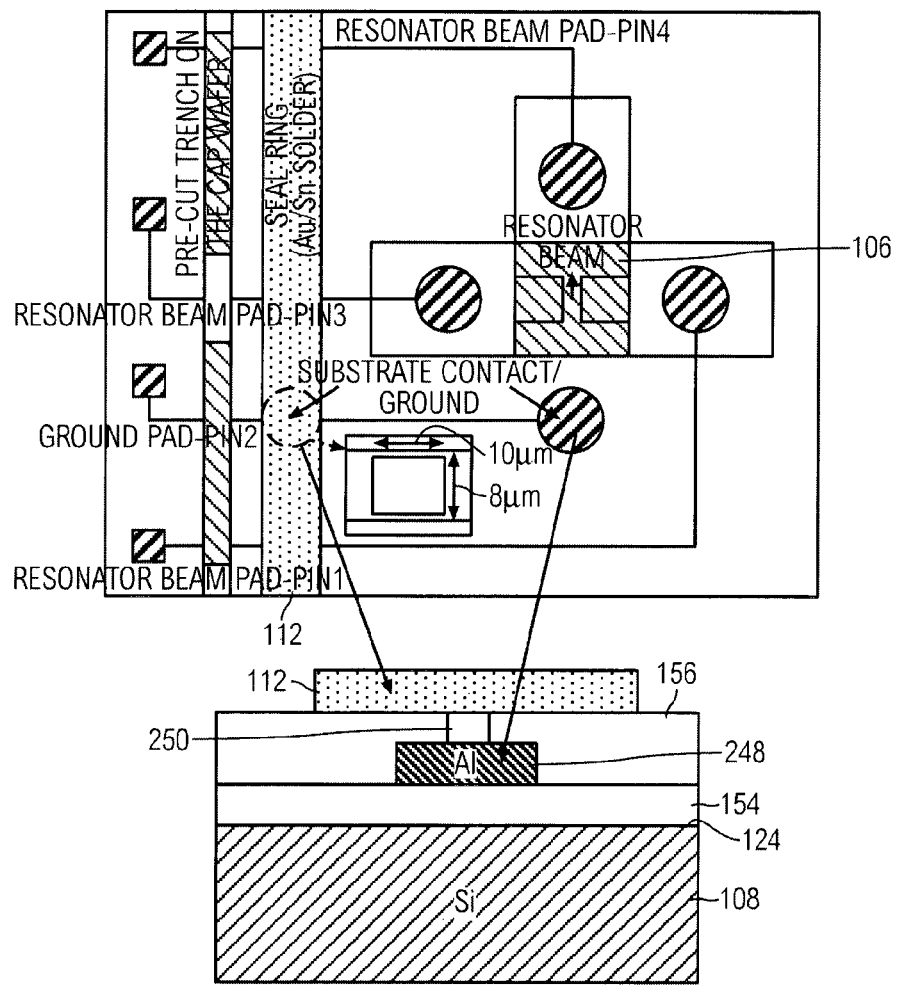
FIG. 10 shows a cross-sectional view of a conformal sealing ring with connection to a ground connection according to an embodiment.

FIG. 10 shows a cross-sectional view of a conformal sealing ring 112 with connection to a ground connection 248 according to an embodiment.

FIG. 10 shows a cap wafer 108 with a first cap surface 124, a cap dielectric layer 154 disposed on the first cap surface 124 of the cap wafer 108 and a ground contact 248, for example aluminum disposed on the cap dielectric layer 154. FIG. 10 also shows a dielectric layer, for example the first electrical interconnect dielectric layer 156, disposed over the ground contact 248 and a conformal sealing ring 112 in contact with the ground contact 248.

An opening 250 may be formed in the dielectric layer 154 so that the conformal sealing ring 112 may be connected to the ground contact 248 to provide localized grounding of the MEMS device 106.

Figure 11A:
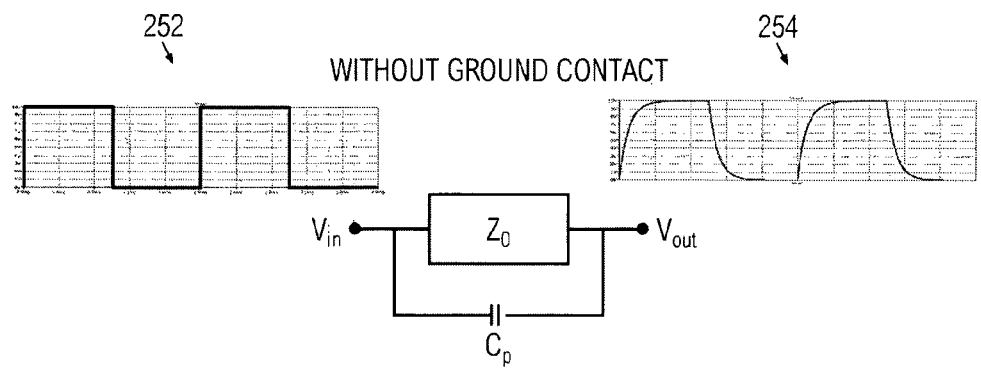
FIG. 11A shows a circuit representation of a conformal sealing ring without connection to a ground connection according to an embodiment.
Figure 11B:
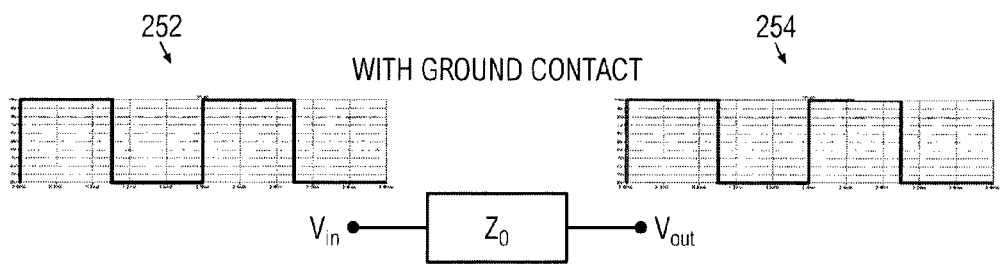
FIG. 11B shows a circuit representation of a conformal sealing ring with connection to a ground connection according to an embodiment.

FIG. 11A shows a circuit representation of a conformal sealing ring 112 without connection to a ground connection or ground contact 248 according to an embodiment and FIG. 11B shows a circuit representation of a conformal sealing ring 112 with connection to a ground connection or ground contact 248 according to an embodiment.

In FIG. 11A, a circuit representation of the conformal sealing ring 112 without connection to a ground connection or ground contact 248 may include a MEMS device resistance (Zo) (i.e. total impedance of the MEMS device) and a parasitic capacitor (Cp) formed by the UBM structure 152 and the first electrical interconnect 132 separated by the first electrical interconnect dielectric layer 156, for example.

A input waveform 252, for example a square waveform may be provided to an input (Vin) of the MEMS device 106 and a resultant waveform 254 or an output waveform may be as shown at the output (Vout) of the MEMS device 106. The amplitude of the resultant waveform 254 may appear lesser than the input waveform 252 and may seemed to have been affected by the presence of the parasitic capacitor (Cp).

In contrast, with grounding of the conformal sealing ring 112 as shown in FIG. 11B, the resultant waveform 254 may appear similar to the input waveform 252 which have been initially provided to the input of the MEMS device 106.

Figure 12:
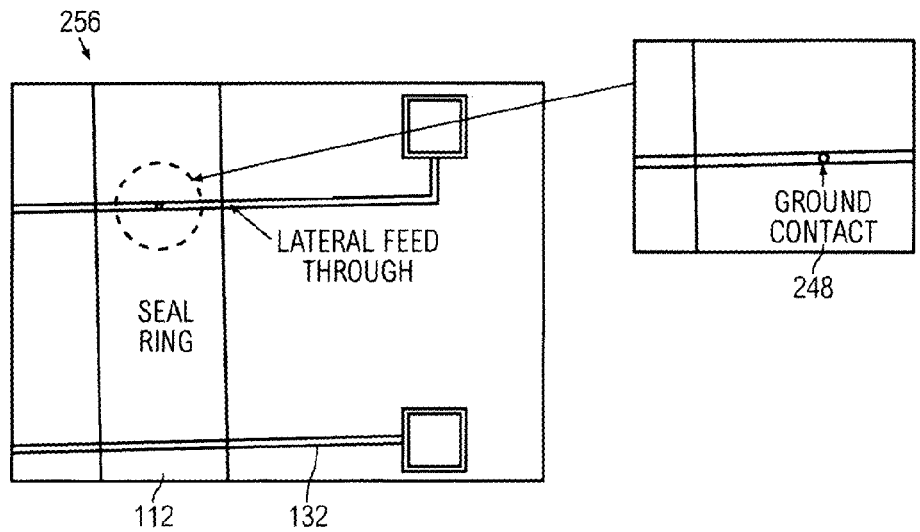
FIG. 12 shows an optical microscope picture of a conformal sealing ring with connection to a ground connection according to an embodiment.

FIG. 12 shows an optical microscope picture 256 of a conformal sealing ring 112 with connection to a ground connection or ground contact 248 according to an embodiment. FIG. 12 also shows the position of the ground connection 248 relative to the first electrical interconnect 132 and the conformal sealing ring 112.

Figure 13:
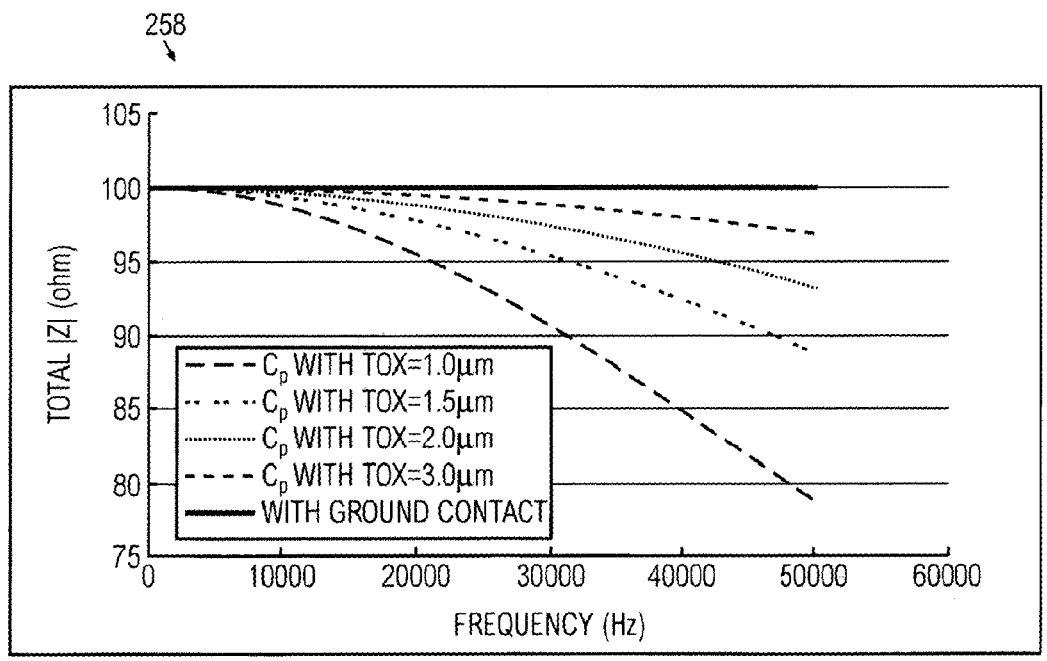
FIG. 13 shows a plot of total impedance versus frequency for capacitors with varying dielectric layer dimensions according to an embodiment.

FIG. 13 shows a plot 258 of total impedance (|Z|) versus frequency for capacitors with varying dielectric layer dimensions e.g. first electrical interconnect dielectric layer 156, second electrical interconnect dielectric layer 158 according to an embodiment.

In FIG. 13, the total impedance (|Z|) may include the resistance part and the reactive part (taking into account a phase shift between voltage and current).

The respective capacitors with varying first electrical interconnect dielectric layer 156 dimensions (tox) may include a capacitor with tox of about 1.0 μm, a capacitor with tox of about 1.5 μm, a capacitor with tox of about 2.0 μm, a capacitor with tox of about 3.0 μm and a capacitor coupled with a ground connection. The conformal sealing ring 112 may include about 300 μm width, the Cp of about 156 pF and a MEMS device resistance of 100 ohm.

From FIG. 13, it may be seen that the capacitor coupled with the ground connection may be the least affected by the change of frequency. In other words, the frequency dependence of the total impedance (|Z|) may be eliminated by the ground connection or ground contact 248.

Figure 14:
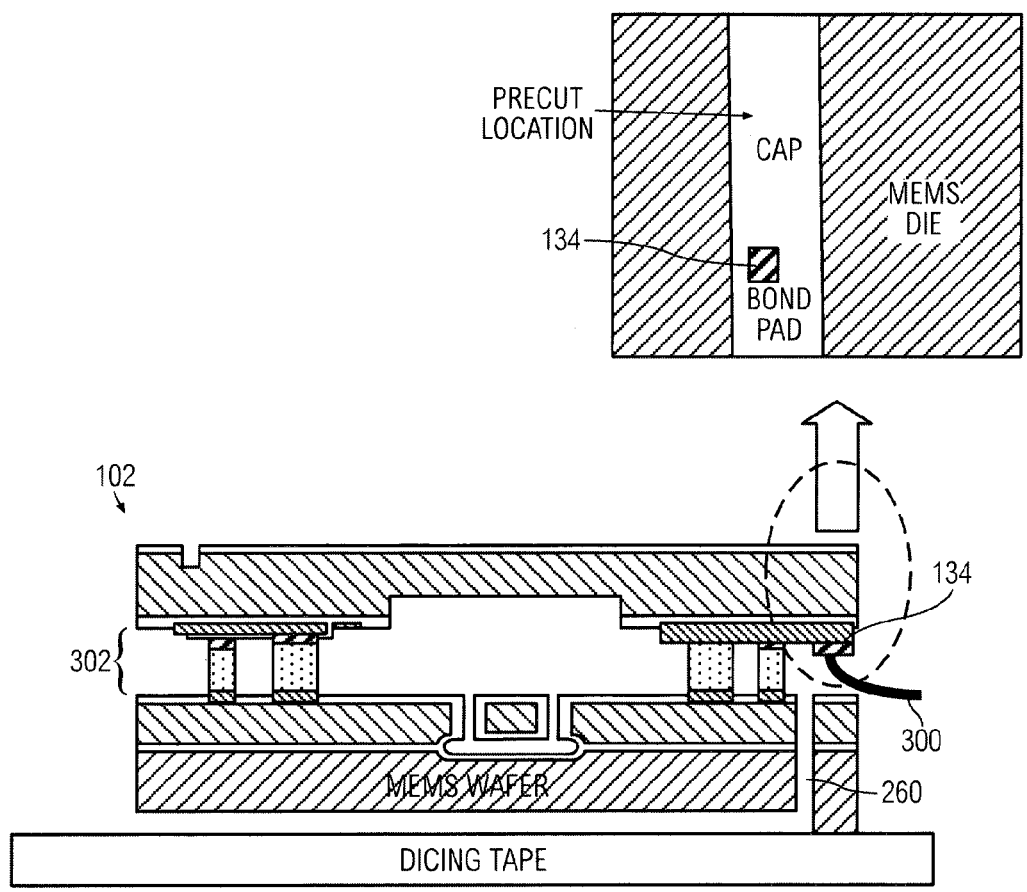
FIG. 14 shows a diced wafer level package after the respective half dicing followed by full dicing of the bonded wafer and according to an embodiment.

FIG. 14 shows a diced wafer level package 102 after the respective half dicing followed by full dicing of the bonded wafer according to an embodiment. The bond pad 134 and the wire bond 300 ability may be as shown in FIG. 14. The gap 302 between the precut dicing 260 and the bond pad 134 may be important so that a sufficient space may be available for the wire-bonding process. But it may not be possible or advantageous to include a large gap 302 because the overall size of the wafer level package 102 may increase.

Figure 15:
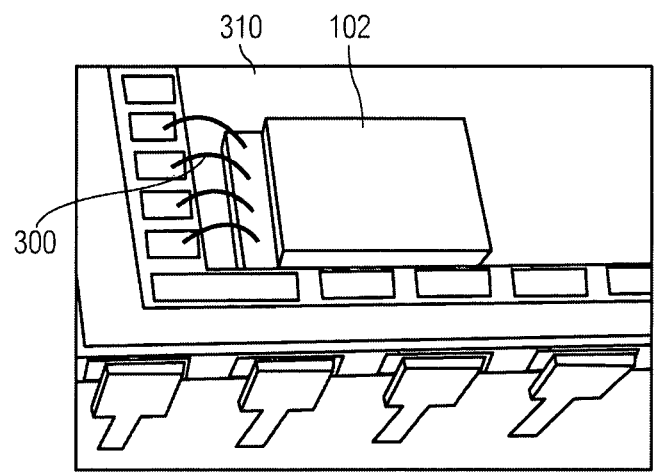
FIG. 15 shows a wafer level package being wire bonded to a ceramic lead frame package according to an embodiment.

FIG. 15 shows a wafer level package 102 being attached to a ceramic leadframe package 310 according to an embodiment. The wafer level package 102 may be wire-bonded for testing purpose. The first electrical interconnect 132 or lateral feed through connection on the cap wafer 108 may be connected by at least one or a plurality wire-bonds 300 (wire-bonding method) to the ceramic leadframe package 310. The functionality of the wafer level package 102 or vacuum inside the wafer level package 102 may be measured only after functional testing. By testing the wafer level package 102, the Q factor of the MEMS device 106 may be measured at the same time as the vacuum inside the wafer level package 102. The current MEMS device 106 may not be tested in wafer level format or means before packaging. The device functionality may be measured only after the vacuum sealing. So testing of the wafer level package 102 may be important in order to understand the device characteristics.

Figure 16:
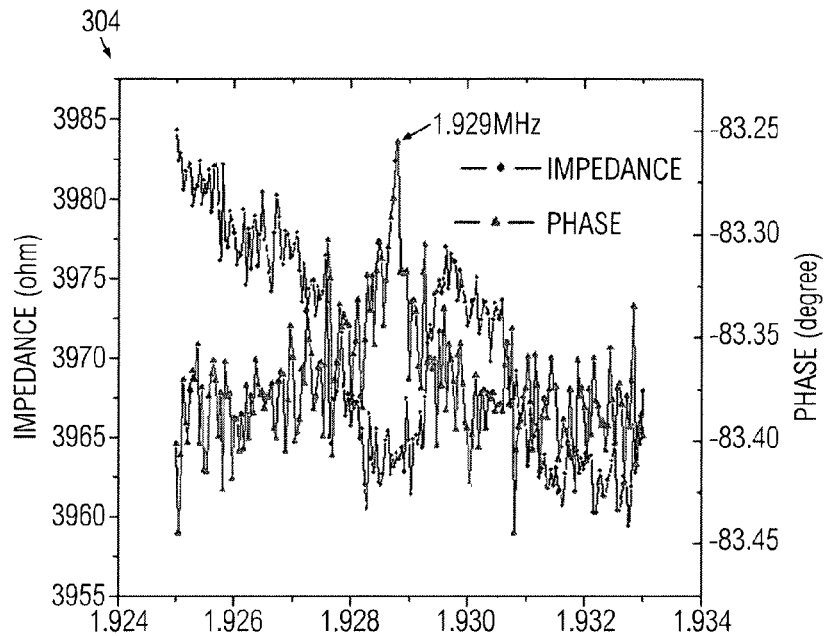
FIG. 16 shows an impedance-phase plot of a wafer level package for a resonator according to an embodiment.

FIG. 16 shows an impedance-phase plot 304 of a wafer level package 102 for a MEMS device 106 (e.g. resonator) according to an embodiment.

FIG. 16 shows the response of frequency with respect to impedance and phase of the the resonator or oscillator device. While sweeping through a range of frequencies, at a particular frequency, i.e. the resonance frequency, there may be a shift in the impedance and phase of the resonator. Resonance frequency may be an important peak depending on the level of vacuum inside the wafer level package 102. The higher the vacuum level, the sharper the resonance frequency curve, which may mean a higher Q factor. If the vacuum level may be lower, then the resonance frequency curve may spread over a wider range of frequencies.

Figure 17:
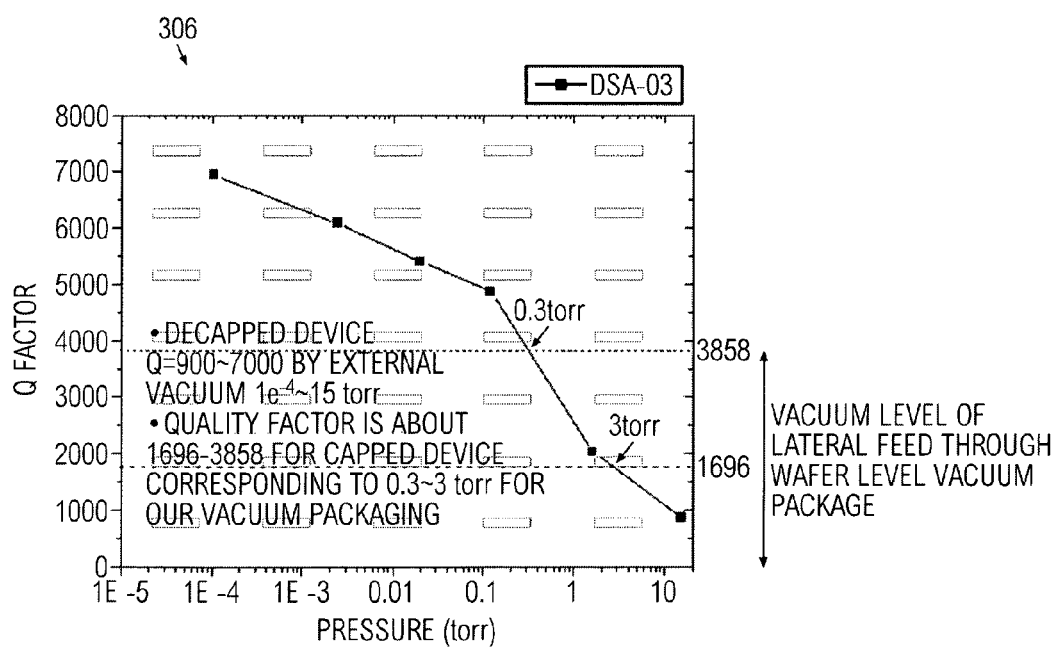
FIG. 17 shows a calibration curve involving respective Q factor and vacuum level versus pressure for a MEMS device according to an embodiment.

FIG. 17 shows a calibration curve 306 involving respective Q factor and vacuum level versus pressure for a MEMS device 106 according to an embodiment.

FIG. 17 is the calibration curve 306 for a particular design of the MEMS device 106 at different vacuum levels. The calibration curve 306 may be plotted by measuring the response of the MEMS device 106 at different vacuum levels or conditions. For measuring the response of the MEMS device 106, a separate package (may or may not be a wafer level package) may be fabricated and the separate package may be connected to an external vacuum pump. By changing the vacuum level or condition from a higher level to lower level, the Q factor may be measured. In general, a higher vacuum level may result in a higher Q factor and a low vacuum level may result in a lower Q factor. Based on this plot 306, an user may be able to find out what may be the vacuum inside the MEMS device 106 by correlating the Q factor measured with the vacuum level from the plot 306.

Figure 18:
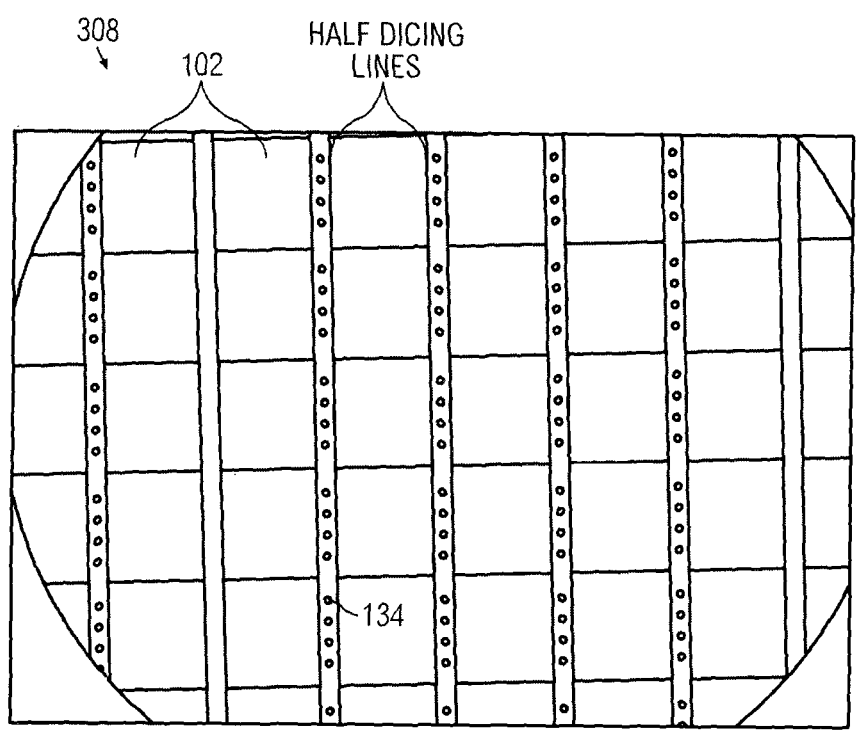
FIG. 18 shows a fully bonded wafer after cut open the lateral feed through to expose the bond pads on the MEMS device according to an embodiment.

FIG. 18. shows a fully bonded wafer 308 including a plurality of wafer level packages 102 after the respective half dicing and full dicing to expose the first external bonding pad 134 on the device wafer according to an embodiment. The half dicing (as indicated in FIG. 18) and the full dicing may be made on the respective device wafer and the cap wafer and the complete MEMS device may be ready for final assembly.

FIG. 18 shows that the dicing method including the half dicing and the full dicing may be made to be precise and there may not be much damage on the lateral feedthrough and at the same time, all the bond pads may be exposed by half dicing or or precut method.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A wafer level package comprising:
a device wafer including a MEMS device;
a cap wafer disposed over the device wafer;
at least one first interconnect disposed between the device wafer and the cap wafer and configured to provide an electrical connection between the device wafer and the cap wafer; and
a conformal sealing ring disposed between the device wafer and the cap wafer and configured to surround the at least one first interconnect and the MEMS device so as to provide a conformally sealed environment for the at least one first interconnect and the MEMS device;
wherein the conformal sealing ring is configured to conform to a respective suitable surface of the device wafer and the cap wafer when the device wafer is bonded to the cap wafer;
wherein the wafer level package further comprises a first electrical interconnect disposed on a first cap surface of the cap wafer and in electrical contact with the at least one first interconnect;
wherein the first electrical interconnect is configured to route the at least one first interconnect along the first cap surface of the cap wafer to crossing the conformal sealing ring to the outside of the sealed environment;
wherein the wafer level package further comprises a cap dielectric layer disposed on the first cap surface of the cap wafer, a ground contact disposed on the cap dielectric layer, and a first electrical interconnect dielectric layer disposed over the ground contact;
wherein the conformal sealing ring is connected to the ground contact via an opening in the first electrical interconnect dielectric layer.

2. The wafer level package of claim 1, further comprising at least one second interconnect disposed between the device wafer and the cap wafer and configured to provide an electrical connection between the device wafer and the cap wafer.

3. The wafer level package of claim 2, wherein the at least one second interconnect is disposed within the conformal sealing ring.

4. The wafer level package of claim 2, wherein the at least one first interconnect is disposed on one side of the MEMS device and the at least one second interconnect is disposed on another side of the MEMS device.

5. The wafer level package of claim 2, further comprising a second electrical interconnect disposed on the cap wafer and in electrical contact with the at least one second interconnect.

6. The wafer level package of claim 5, wherein the second electrical interconnect is configured to route the at least one second interconnect along the first cap surface of the cap wafer to crossing the conformal sealing ring to the outside of the sealed environment.

7. The wafer level package of claim 2 wherein the at least one first interconnect is electrically isolated from the conformal sealing ring and the at least one second interconnect is electrically isolated from the conformal sealing ring.

8. The wafer level package of claim 1, further comprising at least one third interconnect disposed between the device wafer and the cap wafer.

9. The wafer level package of claim 8, wherein the at least one third interconnect is disposed outside of the conformal sealing ring.

10. The wafer level package of claim 1, wherein the conformal sealing ring is connected to a ground connection.

11. A method of forming a wafer level package comprising:
forming a device wafer including a MEMS device;
forming a cap wafer over the device wafer;
forming at least one first interconnect between the device wafer and the cap wafer such that the at least one first interconnect is configured to provide an electrical connection between the device wafer and the cap wafer; and
forming a conformal sealing ring between the device wafer and the cap wafer such that the conformal sealing ring is configured to surround the at least one first interconnect and the MEMS device so as to provide a conformally sealed environment for the at least one first interconnect and the MEMS device;
wherein forming the conformal sealing ring comprises forming the conformal sealing ring such that the conformal sealing ring is configured to conform to a respective suitable surface of the device wafer and the cap wafer when the device wafer is bonded to the cap wafer;
wherein the method further comprises forming a first electrical interconnect on a first cap surface of the cap wafer and in electrical contact with the at least one first interconnect;
wherein forming the first electrical interconnect comprises forming the first electrical interconnect such that the first electrical interconnect is configured to route the at least one first interconnect along the first cap surface of the cap wafer to crossing the conformal sealing ring to the outside of the sealed environment;
wherein the method further comprises forming a cap dielectric layer on the first cap surface of the cap wafer, forming a ground contact disposed on the cap dielectric layer, and forming a first electrical interconnect dielectric layer disposed over the ground contact;
wherein the method further comprises connecting the conformal sealing ring to the ground contact via an opening in the first electrical interconnect dielectric layer.

12. The method of claim 11, further comprising forming at least one second interconnect between the device wafer and the cap wafer such that the at least one second interconnect is configured to provide an electrical connection between the device wafer and the cap wafer.

13. The method of claim 12, wherein forming the at least one second interconnect comprises forming the at least one second interconnect within the conformal sealing ring.

14. The method of claim 12, wherein forming the at least one first interconnect and the at least one second interconnect comprises forming the at least one first interconnect on one side of the MEMS device and forming the at least one second interconnect on another side of the MEMS device.

15. The method of claim 12, further comprising forming a second electrical interconnect on the cap wafer and in electrical contact with the at least one second interconnect.

16. The method of claim 15, wherein forming the second electrical interconnect comprises forming the second electrical interconnect such that the second electrical interconnect is configured to route the at least one second interconnect along the first cap surface of the cap wafer to crossing the conformal sealing ring to the outside of the sealed environment.

17. The method of claim 12, wherein forming the at least one first interconnect and the at least one second interconnect comprises forming the at least one first interconnect and the at least one second interconnect such that the at least one first interconnect is electrically isolated from the conformal sealing ring and the at least one second interconnect is electrically isolated from the conformal sealing ring.

18. The method of claim 11, further comprising forming at least one third interconnect between the device wafer and the cap wafer.

19. The method of claim 18, wherein forming the at least one third interconnect comprises forming the at least one third interconnect outside of the conformal sealing ring.

20. The method of claim 11, wherein forming the conformal sealing ring comprises forming the conformal sealing ring such that the conformal sealing ring is connected to a ground connection.

* * * * *